United States Patent
O'Malley

(10) Patent No.: US 11,568,100 B2
(45) Date of Patent: Jan. 31, 2023

(54) SYNTHETIC SCENARIO SIMULATOR BASED ON EVENTS

(71) Applicant: Zoox, Inc., Foster City, CA (US)

(72) Inventor: Bryan Matthew O'Malley, Oviedo, FL (US)

(73) Assignee: Zoox, Inc., Foster City, CA (US)

( * ) Notice: Subject to any disclaimer, the term of this patent is extended or adjusted under 35 U.S.C. 154(b) by 627 days.

(21) Appl. No.: 16/457,745

(22) Filed: Jun. 28, 2019

(65) Prior Publication Data

US 2020/0410063 A1 Dec. 31, 2020

(51) Int. Cl.
| | |
|---|---|
| G06F 30/20 | (2020.01) |
| G05D 1/00 | (2006.01) |
| G07C 5/02 | (2006.01) |
| G06F 30/333 | (2020.01) |

(52) U.S. Cl.
CPC .......... *G06F 30/20* (2020.01); *G05D 1/0088* (2013.01); *G07C 5/02* (2013.01); *G05D 2201/0213* (2013.01); *G06F 30/333* (2020.01)

(58) Field of Classification Search
CPC .......... G05D 1/0088; G06F 30/20; G07C 5/02
USPC .......................................................... 703/2
See application file for complete search history.

(56) References Cited

U.S. PATENT DOCUMENTS

| | | | |
|---|---|---|---|
| 9,043,129 B2 | 5/2015 | Bonefas et al. | |
| 9,507,346 B1 * | 11/2016 | Levinson | G06F 3/1454 |
| 9,606,539 B1 * | 3/2017 | Kentley | G05D 1/0088 |
| 9,612,123 B1 * | 4/2017 | Levinson | G01S 5/16 |
| 9,632,502 B1 * | 4/2017 | Levinson | H04L 67/10 |
| 9,720,415 B2 * | 8/2017 | Levinson | G05D 1/0257 |
| 9,874,878 B2 | 1/2018 | Wang | |
| 10,176,278 B2 | 1/2019 | Belmans | |
| 10,482,003 B1 * | 11/2019 | Bondor | G06F 30/15 |
| 10,496,766 B2 * | 12/2019 | Levinson | G06F 30/20 |
| 10,534,370 B2 | 1/2020 | Cavalcanti et al. | |
| 10,816,982 B2 * | 10/2020 | Lee | G08G 1/096783 |
| 10,852,721 B1 * | 12/2020 | Smith | G05D 1/0022 |
| 11,086,318 B1 * | 8/2021 | Davis | G05D 1/0291 |

(Continued)

OTHER PUBLICATIONS

Rosique et al. (A Systematic Review of Perception System and Simulators for Autonomous Vehicles Research, 2019, MDPI, pp. 1-29) (Year: 2019).*

(Continued)

*Primary Examiner* — Iftekhar A Khan
(74) *Attorney, Agent, or Firm* — Lee & Hayes, P.C.

(57) ABSTRACT

A vehicle can capture data that can be converted into a synthetic scenario for use in a simulator. Objects can be identified in the data and attributes associated with the objects can be determined. The data can be used to generate a synthetic scenario of a simulated environment. The scenarios can include simulated objects that traverse the simulated environment and perform actions based on the attributes associated with the objects, the captured data, and/or interactions within the simulated environment. In some instances, the simulated objects can be filtered from the scenario based on attributes associated with the simulated objects and can be instantiated and/or destroyed based on triggers within the simulated environment. The scenarios can be used for testing and validating interactions and responses of a vehicle controller within the simulated environment.

20 Claims, 8 Drawing Sheets

(56) References Cited

U.S. PATENT DOCUMENTS

| | | | |
|---|---|---|---|
| 11,150,660 B1* | 10/2021 | Kabirzadeh | G05D 1/0088 |
| 11,210,537 B2 | 12/2021 | Koivisto et al. | |
| 11,288,693 B2 | 3/2022 | Bronicki | |
| 11,460,857 B1* | 10/2022 | Tan | G05D 1/0253 |
| 2012/0083982 A1* | 4/2012 | Bonefas | G05D 1/0223 |
| | | | 382/153 |
| 2014/0180653 A1* | 6/2014 | Belmans | A63F 13/35 |
| | | | 703/2 |
| 2017/0023945 A1* | 1/2017 | Cavalcanti | G08G 1/04 |
| 2017/0075359 A1* | 3/2017 | Wang | G01C 21/1652 |
| 2017/0132334 A1 | 5/2017 | Levinson et al. | |
| 2018/0307245 A1* | 10/2018 | Khawaja | B60W 30/00 |
| 2019/0079194 A1* | 3/2019 | Kuffner | G05D 1/0242 |
| 2019/0129831 A1* | 5/2019 | Goldberg | G06F 3/04847 |
| 2019/0205667 A1* | 7/2019 | Avidan | G06V 10/772 |
| 2019/0278290 A1* | 9/2019 | Zhang | G01C 21/3848 |
| 2020/0084278 A1* | 3/2020 | Cheng | H04W 4/44 |
| 2020/0134494 A1* | 4/2020 | Venkatadri | B60W 40/10 |
| 2020/0192365 A1* | 6/2020 | Russell | G08G 1/0133 |
| 2020/0292326 A1* | 9/2020 | Rabel | G06V 20/588 |
| 2020/0341466 A1* | 10/2020 | Pham | G06N 3/088 |
| 2020/0393845 A1* | 12/2020 | Wang | B60R 1/00 |
| 2020/0410062 A1 | 12/2020 | O'Malley | |
| 2020/0410063 A1* | 12/2020 | O'Malley | G07C 5/02 |
| 2020/0410254 A1* | 12/2020 | Pham | G06K 9/6267 |
| 2021/0024224 A1* | 1/2021 | Mohan | G07C 5/0808 |
| 2021/0096571 A1* | 4/2021 | Modalavalasa | G05D 1/0027 |
| 2021/0201145 A1* | 7/2021 | Pham | G06N 3/04 |
| 2021/0286925 A1* | 9/2021 | Wyrwas | G07C 5/085 |
| 2021/0303882 A1* | 9/2021 | Mallela | G01C 21/3602 |
| 2021/0309223 A1* | 10/2021 | Zhu | B60W 60/0027 |
| 2021/0341921 A1* | 11/2021 | Davis | G05D 1/0257 |

OTHER PUBLICATIONS

Kar et al. (Meta-Sim: Learning to Generate Synthetic Datasets, 2019, arXiv, pp. 1-14) (Year: 2019).*

The PCT Search Report and Written Opinion dated Sep. 24, 2020 for PCT Application No. PCT/US20/39796, 9 pages.

Office Action for U.S. Appl. No. 16/457,679, dated Dec. 17, 2021, O'Malley, "Synthetic Scenario Generator Based on Attributes", 29 pages.

Notification Concerning Transmittal of International Preliminary Report on Patentability for PCT Application No. PCT/US20/39796, dated Jan. 6, 2022, 7 pages.

The International Preliminary Report on Patentability for PCT App No. PCT/US20/39796, dated Dec. 28, 2021, 6 pages.

Office Action for U.S. Appl. No. 16/798,073, dated Apr. 25, 2022, O'Malley, "Synthetic Scenario Generator Using Distance-Biased Confidences for Sensor Data", 19 pages.

Office Action for U.S. Appl. No. 16/457,679, dated Apr. 29, 2022, O'Malley, "Synthetic Scenario Generator Based on Attributes", 31 pages.

* cited by examiner

200 ⟶

Log Data Attributes Table 202

|  | $t_0$ | $t_1$ | $t_2$ |
|---|---|---|---|
| OBJECT 1 |  |  |  |
| LENGTH | 5.1 | 5.2 | 0.3 |
| CLASSIFICATION | CAR | CAR | CYCLIST |
| VELOCITY | 4.5 | 4.8 | 4.5 |
| OBJECT 2 |  |  |  |
| LENGTH | 5.0 | 4.9 | 13.0 |
| CLASSIFICATION | CAR | CAR | TRUCK |
| VELOCITY | 4.2 | 4.8 | 4.3 |
| OBJECT 3 |  |  |  |
| LENGTH | 4.6 | 4.5 | 4.5 |
| CLASSIFICATION | CAR | CAR | CAR |
| VELOCITY | 5.0 | 5.1 | 54.6 |

Computing Device(s) 208 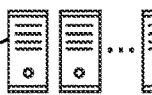 --- Attributes Component 206

Estimated Attributes Table 204

|  | $t_x$ | $t_y$ | $t_z$ |
|---|---|---|---|
| OBJECT 1 |  |  |  |
| LENGTH | 10.3 | 10.3 | 10.3 |
| CLASSIFICATION | CAR | CAR | CAR |
| VELOCITY | 4.6 | 4.7 | 4.6 |
| OBJECT 2 |  |  |  |
| LENGTH | 10.3 | 10.3 | 10.3 |
| CLASSIFICATION | CAR | CAR | CAR |
| VELOCITY | 4.5 | 4.5 | 4.4 |
| OBJECT 3 |  |  |  |
| LENGTH | 4.5 | 4.5 | 4.5 |
| CLASSIFICATION | CAR | CAR | CAR |
| VELOCITY | 5.0 | 5.3 | 5.7 |

Estimated Attribute 210

FIG. 2

SYNTHETIC SCENARIO SIMULATOR BASED ON EVENTS

BACKGROUND

Simulated data and simulations can be used to test and validate the functionality of a system, some of which would be otherwise prohibitive to test in the real world (e.g., due to safety concerns, limitations on time, repeatability, etc.). However, creating simulations which accurately reflect scenarios to be tested may be difficult to create, as data used to create such simulations may be noisy, inconsistent, and/or incomplete. Additionally, such data may make testing updated system algorithms otherwise impossible when based on static data.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 2 depicts an example dataset of object attributes associated with log data and an example dataset of object attributes associated with simulation instructions.

DETAILED DESCRIPTION

Figure 1:
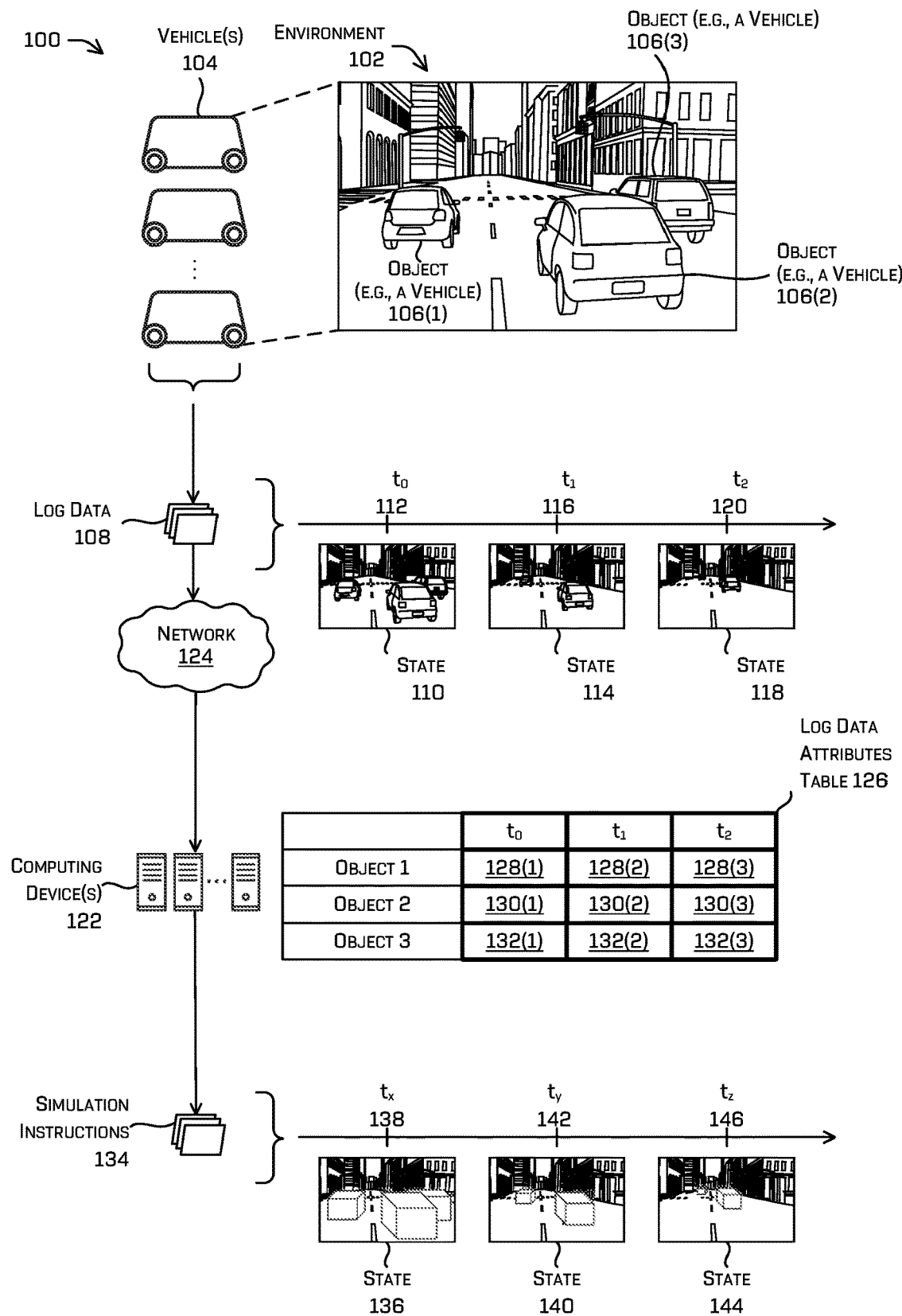
FIG. 1 is an illustration of vehicle(s) generating log data and transmitting the log data to computing device(s) that determines attributes associated with objects and generates simulation instructions for a simulated environment.

This disclosure describes systems, methods, and apparatuses for generating simulation scenarios. In at least some examples, such simulations can be used to test a controller of an autonomous vehicle. Simulations can be used to validate software (e.g., an autonomous controller) executed on autonomous vehicles to ensure that the software is able to safely control such autonomous vehicles. In additional or alternative examples, simulations can be used to learn about the constraints of autonomous vehicles that use the autonomous controller. For instance, simulations can be used to understand the operational space of an autonomous vehicle (e.g., an envelope of parameters in which the autonomous controller effectively controls the autonomous vehicle) in view of surface conditions, ambient noise, faulty components, etc. Simulations can also be useful for generating feedback for improving operations and designs of autonomous vehicles. For instance, simulations can be useful for determining an amount of redundancy that is required in an autonomous controller, or how to modify a behavior of the autonomous controller based on what is learned through simulations. Furthermore, in additional and alternative examples, simulations can be useful to inform the hardware design of autonomous vehicles, such as optimizing placement of sensors on an autonomous vehicle.

When creating a simulation environment to perform testing and validation, it is possible to specifically instantiate the environment with various and specific examples. Each instantiation of such an environment can be unique and defined. Enumerating all possible scenarios manually can require inordinate amounts of time and, if not every possible scenario is constructed, various scenarios can go untested. Additionally, even though multiple scenarios can be described, there is no guarantee that the additional scenarios provide any additional, useful, information. For example, incremental differences in starting positions of simulated vehicles at an intersection can only provide marginal, if any, additional useful information about the ability of an autonomous vehicle to respond in the scenario given a particular set of computer code. However, previously recorded sensor data from a system operating in an environment, such as an autonomous vehicle traversing an environment (which may include occasions of controller disengagement or other challenging scenarios), provides many examples for generating scenarios. Therefore, previously recorded sensor data can be used to quickly and efficiently generate high quality scenarios for testing.

In some instances, the log data can include abnormalities and/or inconsistencies. For example, the log data can indicate that an object in the environment (such as a parked vehicle) can change in size or position over time, which may not accurately represent the world. In some instances, other attributes of objects can be identified as inconsistent such as a pose of an object, a velocity, a classification, a trajectory, etc. In some instances, the log data can include a confidence level associated with an attribute. By way of example and without limitation, the log data can indicate that an object has a pedestrian classification and a confidence level of 5% associated with the pedestrian classification which can be considered low compared to a confidence level threshold. Such discrepancies may reflect errors in one or more subsystems to be tested. However, such discrepancies may be immaterial for testing other subsystems. A scenario generator can detect/identify the inconsistencies and generate simulation instructions that remove the inconsistencies. For example, the scenario generator can discard inconsistent data and/or replace inconsistent data to smooth out the inconsistent log data when generating the simulation instructions. Removing the inconsistencies in object attributes can improve the quality of testing and validation when the purpose of simulation can be to test and validate a response of a simulated vehicle to various scenarios.

In some instances, the purpose of simulation can be to test and validate a response of a simulated vehicle to a defective and/or a faulty sensor of the vehicle. In such an example, the scenario generator can be configured to introduce inconsistencies in attributes associated with a simulated object in a simulated environment.

A vehicle or multiple vehicles can traverse an environment and generate log data associated with the environment. In some examples, log data may include raw sensor data and/or data based on sensor data (e.g., bounding boxes, velocities, classifications, object dimensions, etc.). Examples of data generated by a vehicle that can be included in the log data 108 can be found, for example, in U.S. patent application Ser. No. 15/644,267 titled "Interactions Between Vehicle and Teleoperations System" and filed Jul. 7, 2017 (describing communication signals that can include sensor data and data indicating an occurrence of an event as well vehicle control data that can be derived from data received from a sensor and a planner, an object data calculator, an object classifier, a collision predictor system, a kinematics calculator, a safety system actuator, and a control operation of the drive system), U.S. patent application Ser. No. 15/693,700 titled "Occupant Protection System Including Expandable Curtain and/or Expandable Bladder" and filed Sep. 1, 2017 (describing data representative of a trajectory of the vehicle, location data, object data, and vehicle control data, and U.S. patent application Ser. No. 16/198,653 titled "Executable Component Interface and Controller" filed Nov. 21, 2018 (describing a type of log data), which are each incorporated by reference in their entirety.

The log data can be used to generate simulation instructions that, when executed by a simulator, generate a simulated environment. When generating the simulation instructions, the scenario generator can identify objects represented in the log data. For example, the scenario generator can use perception data to determine the objects of the environment. The objects can include static objects (e.g., buildings, trees, road surfaces, road markers, signage, etc.) and dynamic objects (e.g., vehicles, pedestrians, animals, bicyclists, motorcycles, etc.).

In some instances, the scenario generator can determine an amount of interaction between the vehicle and the objects. For purposes of illustration only, the log data can indicate that the vehicle performed a lane change action, a turning action, and/or an acceleration action, etc. based on a detection of an object, an action associated with the object, and/or a predicted action associated with the object. In some instances, the scenario generator can omit objects from the simulated scenario that do not meet or exceed a threshold level of interaction with the vehicle. By excluding objects that do not meet or exceed the threshold level of interaction with the vehicle, the scenario generator can reduce an amount of computational resources required to generate and execute the simulated scenario.

In at least some examples, merely instantiating a simulation with log data may cause other errors and/or lead to invalid tests, for example. In some such examples, when a planning algorithm of the autonomous vehicle controller is altered, for example, objects traversing the environment according to temporal triggers may not interact with the simulated autonomous vehicle as intended to test such updated planning algorithms. To rectify such deficiencies, and after identifying the objects for use in the simulated scenario, the scenario generator can determine object attributes associated with the objects. For purposes of illustration only, the log data can represent a period of time that runs from time $t_0$ time $t_5$. The scenario generator can identify a pedestrian that is detected by the vehicle at a time $t_1$ and becomes occluded by a tree at time $t_3$. The scenario generator can associate object attributes with the pedestrian that correspond to, for example, each time that the vehicle can detect the pedestrian (e.g., $t_1$, $t_2$, and $t_3$). The object attributes can include attributes such as an object extent (also referred to as an object size), an object classification, an object pose, an object trajectory, an object waypoint, an object instantiation attribute, and/or an object termination attribute (also referred to as a destruction attribute). In any number of examples, such attributes can be translated from a temporal connotation to a contextual connotation. As a non-limiting example, if a pedestrian enters a crosswalk at $t_5$ at a point when the vehicle is a distance, d, away, the simulation may instantiate the pedestrian in the crosswalk not at $t_5$, but when a distance, d, from the crosswalk.

Additional object parameters can be determined and instantiated as determined herein. The object extent can indicate a size and/or volume of the object (e.g., a length, a width, and/or a height in meters). The object classification can indicate a classification and/or type of the object (e.g., a vehicle, a pedestrian, a bicyclist, etc.). The object pose can indicate an object's x-y-z coordinates (e.g., a position or position data) in the environment and/or can include a pitch, a roll, and/or a yaw associated with the object. The object trajectory can indicate a trajectory followed by the object. In some instances, the vehicle can predict a trajectory and the trajectory can include a predicted trajectory associated with the object. The object waypoint can indicate a position in the environment that indicates a route between two locations. For example, an object can travel from a location A to a location C through a waypoint B. The object instantiation attribute can indicate how the vehicle detected the object. In any such examples, contextual connotations determined using such waypoints can include a time to instantiate the object in simulation and/or destroy the object from simulation. For example, to instantiate, the object can enter a detection range of the vehicle by: (1) the vehicle approaching the object, (2) the object approaching the vehicle, and/or (3) the object becoming visible or an occlusion cessation of the object. The object termination attribute can indicate how the vehicle can no longer detect the object. For example, destruction can be associated with when the object is in a position outside of the detection range of the vehicle by: (1) the vehicle moving away from the object, (2) the object moving away from the vehicle, and/or (3) the object becoming occluded or an occlusion of the object.

The scenario generator can determine object attributes for none, some, or all of the objects to be included in the simulated scenario. As discussed above, the log data can include abnormalities and/or inconsistencies. For example, the log data can indicate that an object in the environment, such as a parked vehicle, can change an extent of the parked vehicle. The scenario generator can use the determined object attributes to identify the inconsistencies in the log data.

In some instances, the scenario generator can determine that an attribute is inconsistent based on an attribute threshold. For purposes of illustration only, the log data can indicate that an object with a truck classification can have a z-axis attribute value of 0.5 meters indicating that the object is not in contact with the ground and is 0.5 meters above the ground. The scenario generator can have a z-axis threshold of 0.2 meters and determine that the object has an inconsistent attribute as an object with a truck classification should not have a z-axis attribute value that meets or exceeds 0.2 meters.

In some instances, the scenario generator can determine that an attribute is inconsistent based on a standard deviation calculation. For purposes of illustration only, the log data can indicate that an object with a pedestrian classification can have an extent that indicates a height of 2 meters at a first time, 2.1 meters at a second time, and 4 meters at a third time. The scenario generator can determine an arithmetic mean of 2.7 meters and a standard deviation of 0.92 meters. The scenario generator can be configured to have a threshold of one standard deviation and determine that the extent of 4d meters exceeds the single standard deviation threshold and determine that the extent of 4 meters is inconsistent. Other techniques for determining an inconsistent attribute are contemplated such as Z-Score, Dbscan, Isolation Forests.

The scenario generator can determine an estimated attribute (e.g., an updated object attribute) to replace the inconsistent attribute. The updated object attribute can include, for example, an updated object size, an updated object classification, an updated object pose, an updated object trajectory, an updated object waypoint, and the like. For purposes of illustration only, the scenario generator can discard the extent of 4 meters and use a mean algorithm and replace the 4 meters with the mean of the remaining extent attribute values (e.g., 2.05 meters). In some instances, the scenario generator can use a median algorithm and/or a mode algorithm. In some instances, the scenario generator can use smoothing algorithms such as Additive smoothing, Butterworth filters, Chebyshev filters, Exponential smoothing, Kalman filters, Kernal smoothers, Local regression, and/or moving averages, etc.

In some instances, the scenario generator can discard or otherwise modify attributes based on other attributes associated with the vehicle. By way of example and without limitation, the log data can indicate that an object is a parked vehicle while also having a velocity attribute associated with the object. The scenario generator can determine that a parked vehicle having a velocity is inconsistent and can discard the velocity data associated with the parked vehicle object. In some instances, the log data can indicate that an object is associated with a semi-truck trailer object type (e.g., a classification) and that the object is associated with acceleration attributes that are inconsistent with a semi-truck trailer (e.g., the object accelerates too quickly for a vehicle of that amount of mass). Then the scenario generator can discard the acceleration data associated with the semi-truck trailer object. In some instances, the scenario generator can replace the inconsistent attributes with estimated attributes based on the classification (e.g., an average acceleration rate associated with a semi-truck trailer).

By replacing the inconsistent attribute values with estimated attribute values, the simulation can result in more valuable simulation data. For example, a simulated vehicle can traverse an environment begin to pass a parked vehicle in a parking lane. As the vehicle passes the parked vehicle, without the estimated attribute values, the extent of the parked vehicle could dramatically increase and cause a simulated collision with the vehicle. This would result in an unrealistic simulation and can consume computational resources without yielding productive simulation data.

The scenario generator can associate the instantiation attribute and/or the termination attribute with a trigger region in the simulated scenario. For example, the log data can indicate that the vehicle detected a pedestrian at a distance of 50 meters ahead of the vehicle as the vehicle traversed along a trajectory. The scenario generator can determine a trigger region based on the distance of 50 meters and instantiate the simulated pedestrian in the simulated environment when the simulated vehicle reaches the trigger region at 50 meters to the pedestrian (e.g., the contextual connotation described in detail above). In some instances, the scenario generator can determine a trigger region to increase a likelihood of interaction with an object. For purposes of illustration only, the log data can indicate that the pedestrian crosses in front of the vehicle at the distance of 50 meters to the pedestrian. The scenario generator can determine a trigger region of 5 meters to the pedestrian such that when the simulated vehicle crosses the trigger region, the simulated pedestrian will be instantiated 5 meters from the vehicle and cross the street to increase a likelihood of interaction with the simulated pedestrian and the simulated vehicle.

In some instances, the scenario generator can associate the termination attribute of a simulated object with a time threshold and/or a perception threshold. For purposes of illustration only, the scenario generator can determine a time threshold that can be 20 seconds and/or a perception threshold of 100 meters. During an execution of the simulated scenario, the scenario generator can determine a simulation parameter associated with the simulated object such as the amount of time that the object has been simulated in the scenario and/or a distance from the simulated vehicle. The scenario generator can determine that the simulation parameter has met or exceeded the time threshold and/or the perception threshold and destroy the object from the simulation.

By instantiating and terminating objects based on trigger regions and/or simulation parameters, the simulation of the vehicle controller can consume fewer computational resources by reducing the number of objects to simulate. Additionally, as the simulated vehicle traverses the simulated environment, the actions taken by objects can be tied to the behavior of the simulated vehicle rather than a specific time. For purposes of illustration only, the log data can indicate that a pedestrian crossed a sidewalk in front of the vehicle at a time $t_3$. In the simulated scenario, the simulated vehicle could perform a stopping action at time $t_1$ and not arrive at the crosswalk until time $t_4$. If the simulated pedestrian crossing the sidewalk is tied to a time, then the simulated pedestrian may have completed crossing the crosswalk before the simulated vehicle reaches the crosswalk. Instead, the action of the simulated pedestrian crossing the crosswalk can be associated with a trigger region and can increase the likelihood of the simulated vehicle interacting with the simulated pedestrian.

In some instances, the scenario generator can infer or determine an estimated trajectory associated with an object. For example, the log data can indicate that the vehicle did not detect a previous location or a later location of an object because the object was occluded. For purposes of illustration only, the vehicle can traverse an environment and arrive at an intersection with a crosswalk with a pedestrian waiting to cross the crosswalk. After the pedestrian crosses the crosswalk, the pedestrian can become occluded by an object such as a tree. When executed in a simulator, this can result in the simulated pedestrian stopping and no longer moving in the environment. The scenario generator can determine an estimated trajectory associated with the pedestrian to generate a more realistic scenario. For example, the scenario generator can determine the estimated trajectory based on a classification of the object, an observed trajectory (e.g., as represented in the log data), a velocity of the object, etc. For purposes of illustration only, after the simulated pedestrian crosses the crosswalk, the scenario generator can use the velocity attribute to determine that the simulated pedestrian can maintain a velocity and continue walking in the direction of travel indicated by the observed trajectory while still using, for example, an object controller to control the simulated pedestrian based on the simulated environment.

Within the simulated environment, motion of simulated objects can be initialized based on the log data, but can vary based on costs and/or waypoints associated with the simulated objects as the simulated objects react to a simulated autonomous vehicle or vehicle controller.

As noted above, the log data can include sensor data captured by one or more sensors of the vehicle or can include data based on such sensor data. For example, log data can include, but is not limited to, one or more of perception data indicating objects identified by one or more systems onboard the vehicle (or produced during a post-processing phase), prediction data indicating an intent of objects (whether produced during the recording or subsequent thereto), and/or status data indicating diagnostic information, trajectory information, and other information generated by the vehicle.

The vehicle can transmit the log data, via a network, to a database that stores log data and/or to a computing device executing a scenario generator and simulator (also referred to as a scenario generator). As discussed above, the log data can include perception data that identifies objects (e.g., roads, sidewalks, road markers, signage, traffic lights, other vehicles, pedestrians, cyclists, animals, etc.) and/or bounding boxes that represent the objects. The scenario generator can use the log data to generate simulation instructions to simulate a scenario. For example, the environment (e.g., roads, buildings, signage, etc.) traversed by the vehicle can be represented as a simulated environment in the simulated scenario. The simulated scenario can be identical to the captured environment or deviate from the captured environment. For example, the simulated environment can have more or fewer number of buildings as in the captured environment. Additionally, objects (e.g., other vehicles, pedestrians, animals, cyclists, etc.) in the log data can be represented as simulated objects and the vehicle can be represented as a simulated vehicle. In at least some examples, such simulated data may comprise only information about static and dynamic entities (e.g., exclusive of buildings, roads, etc.). In such examples, the simulated environment may comprise previously generated (or otherwise available) maps and/or representations of the recorded environment.

The simulated vehicle can represent an autonomous vehicle that is controlled by an autonomous controller that can determine a trajectory, based at least in part, on the simulated environment. In such an example, the same and/or similar systems may be tested in software and/or hardware.

The log data can include an event of interest. In some instances, an event of interest can include detecting a collision with another object, a violation of a traffic rule (e.g., a speed limit), and/or a disengagement where a human driver takes control of the operation of the vehicle from an autonomous controller. In some instances, an event of interest can include an error condition and/or a warning such as a low battery power event. Further, an event of interest can include a lane change, a change of direction (of object(s) in the environment), a change in velocity (of object(s) in the environment), and the like.

In some instances, the vehicle computing device can be configured to detect a safety concern and/or an uncertainty and transmit a request, in addition to the status data, to a remote computing device associated with a teleoperator. The teleoperator can assess the situation and provide guidance to the vehicle. After receiving the guidance (and/or a command, in general), the vehicle can continue operation in order to achieve a safe outcome in response to the event of interest. For example, an object can block a roadway that can lead to the vehicle determining a different route from a preplanned route or a teleoperator can provide the guidance to respond to the blockage. In some instances, the vehicle can generate an event marker in the log data that provides an indication that an event of interest occurred at a particular time. Then, the scenario generator can select the log data, by identifying the event of interest and/or by identifying the event marker. Using the log data and/or the event, the scenario generator can generate simulation instructions that can be used to execute a simulated scenario by representing the captured environment in the simulated scenario along with simulated objects.

In some instances, the scenario generator can identify a portion of the log data to use to generate the simulated scenario. For example, the scenario generator can identify a portion of the log data prior to the event that corresponds to a period of time (e.g., 20 seconds) and another portion of the log data following the event that correspond to another period of time (e.g., 10 seconds). In some instances, the scenario generator can use a default period of time and/or the scenario generator can use a user configurable period of time.

The scenario generator can execute the simulated scenario and generate simulation data that indicates how an autonomous controller and/or other objects would respond given the simulated scenario. For example, the simulation data can include control output generated by the simulated autonomous controller. Additionally, the simulation data can indicate how objects would respond given the simulated scenario. For example, the scenario generator can represent the vehicle as a simulated vehicle that traverses the simulated environment using an autonomous controller. In some instances, the simulated vehicle can be controlled using a controller that is the same as or that is different than the controller used by the vehicle that generated the log data. In a scenario where a simulated controller is different than a controller used to capture the log data, the simulated vehicle can perform actions that deviate from the vehicle as represented in the log data. For purposes of illustration only, a simulated controller may represent different planning algorithms or driving behaviors (e.g., different acceleration or braking profiles) that may introduce differences between the log data and simulated data. Additionally, in the event that the vehicle which collected the data was manually operated (even for a small portion of time), there may be the same discrepancies between the actual log data and how the data would evolve given the autonomous vehicle controller.

In some instances, the scenario generator can determine the actions of a simulated object in the simulated environment based on the log data. For example, the simulated object can perform actions associated with the object as represented in the log data. In some instances, the scenario generator can associate a controller with the simulated object, where the controller can determine trajectories for the object that deviate from the log data. Thus, the simulated object can perform actions associated with the object as represented in the log data and/or perform actions that deviate from the object as represented in the log data. Thus, the simulated object can intelligently react to deviations in the behavior of the simulated vehicle. For purposes of illustration only, in a scenario where a simulated object is following a simulated vehicle, if the simulated vehicle begins braking sooner or more aggressively than the braking behavior represented in the log data, the simulated object may modify its trajectory by braking sooner or changing lanes, for example, to avoid a collision or near-collision with the simulated vehicle.

In some instances, the controller associated with the simulated vehicle can be the same controller associated with the simulated objects. In some instances, the scenario generator can associate a controller with the simulated vehicle that is different from the controller associated with the simulated objects. In some instances, the scenario generator can determine a difference between actions performed by the object as represented in the log data and actions performed by the simulated object in the simulation data.

The techniques discussed herein can improve a functioning of a computing device by reducing an amount of required computational resources. For example, a scenario generator can determine trigger regions associated with a simulated object. When a simulated vehicle interacts with a trigger region (e.g., crosses a trigger region), the simulated can instantiate a simulated object in the simulated environment. Rather than instantiate all objects of the simulated environment, the scenario generator can instantiate the objects as the simulated vehicle reaches certain trigger regions to instantiate objects which can reduce the amount of computational resources (e.g., processing resources, memory resources, etc.) required to executed the simulated environment.

Therefore, the functioning of a computing device can be increased by increasing the computing device's ability to determine realistic trajectories and behaviors of simulated objects in an environment. As can be understood, determining an appropriate trajectory for a vehicle can improve safety outcomes, particularly in the context of autonomous vehicle by, for example, producing more realistic reactions to adaptations in vehicle behavior in an environment. Thus, the techniques described herein can improve a functioning of a computing device as well as improve safety outcomes.

The techniques described herein can be implemented in a number of ways. Example implementations are provided below with reference to the following figures. Although discussed in the context of an autonomous vehicle, the techniques described herein can be applied to a variety of systems requiring control and/or interaction with objects in an environment, and is not limited to autonomous vehicles. In another example, the systems, methods, and apparatuses can be used in an aviation or in a nautical context. Additionally, the techniques described herein can be used with real data (e.g., captured using sensor(s)), simulated data (e.g., generated by a simulator), or any combination of the two.

FIG. 1 illustrates a pictorial flow diagram 100 that depicts an environment 102 through which vehicle(s) 104 are traveling. The vehicle(s) 104 can include a computing device that includes a perception engine and/or a planner can perform operations such as detecting, identifying, segmenting, classifying, and/or tracking objects from sensor data captured in the environment 102. For example, the computing device associated with vehicle(s) 104 can detect objects 106(1), 106(2), and 106(3). While objects 106(1), 106(2), and 106(3) are depicted as vehicles in environment 102, objects 106(1), 106(2), and 106(3) can also include cyclists, pedestrians, animals, road markers, signage, traffic lights, buildings, mailboxes, and/or other objects.

The vehicle computing device can include one or more processor(s) and memory communicatively coupled to the one or more processor(s). The one or more processor(s) can include, for example, one or more FPGAs, SoCs, ASICs, and/or CPUs. The vehicle(s) 104 can traverse through the environment 102 and determine and/or capture data. For example, the vehicle computing device can determine vehicle status data, vehicle diagnostic data, vehicle metrics data, and/or map data. In some instances, the vehicle(s) 104 can include one or more sensors where the one or more sensors can include one or more time-of-flight sensors, lidar sensors, radar sensors, sonar sensors, image sensors, audio sensors, infrared sensors, location sensors, wheel encoders, IMUs, etc., or any combination thereof, although other types of sensors are contemplated.

As the vehicle(s) 104 traverses through the environment 102, the sensors can capture sensor data associated with the environment 102. For example, and as discussed above, some of the sensor data can be associated with objects (e.g., vehicles, cyclists, pedestrians, etc.). In some instances, the sensor data can be associated with other objects including, but not limited to, buildings, road surfaces, signage, barriers, etc. Therefore, in some instances, the sensor data can be associated with dynamic objects and/or static objects. The dynamic objects can be objects that are associated with a movement (e.g., vehicles, motorcycles, cyclists, pedestrians, animals, etc.) or capable of a movement (e.g., parked vehicles, standing pedestrians, etc.) within the environment 102. The static objects can be objects that are associated with the environment 102 such as, for example, buildings/structures, road surfaces, road markers, signage, barriers, trees, sidewalks, etc. In some instances, the vehicle computing device can determine information about objects in the environment, such as bounding boxes, classifications, segmentation information, and the like.

The vehicle computing device can use the sensor data to generate a trajectory for the vehicle(s) 104. In some instances, the vehicle computing device can also determine pose data associated with a position of the vehicle(s) 104. For example, the vehicle computing device can use the sensor data to determine position data, coordinate data, and/or orientation data of the vehicle(s) 104 in the environment 102. In some instances, the pose data can include x-y-z coordinates and/or can include pitch, roll, and yaw data associated with the vehicle(s) 104.

The vehicle computing device can generate log data 108. For example, the log data 108 can include the sensor data, perception data, planning data, vehicle status data, velocity data, intent data, and/or other data generated by the vehicle computing device. In some instances, the sensor data can include data captured by sensors such as time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor data can be data captured by such sensors such as time-of-flight data, location data, lidar data, radar data, sonar data, image data, audio data, etc. In some instances, the log data 108 can include time data that is associated with the other data generated by the vehicle computing device.

The log data 108 can represent various states of the environment 102 along a timeline. A state, as shown in FIG. 1 can comprise various representations of an environment (a real environment, an environment as represented by captured sensor data, data based on captured sensor data (e.g., bounding boxes, object classifications, planner decisions, and/or an environment as represented by a simulator) at individual time points or over time. For example, the log data 108 can represent a state 110 of the environment 102 at a time $t_0$ 112. In some instances, the state 110 can be an initial state of the environment 102 that is associated with a beginning (or an arbitrary) portion of the log data 108. In some instances, the state 110 can be a state of the environment 102 that is associated with an arbitrary (e.g., middle) portion of the log data 108. The log data 108 can represent a state 114 of the environment 102 at a time $t_1$ 116 that is after the time $t_0$ 112. As depicted in FIG. 1, the log data 108 can represent a state 118 of the environment 102 at a time $t_2$ 120 that is after the time $t_0$ 112 and $t_1$ 116. For purposes of illustration only, the state 110 can represent the environment 102 at an initial time $t_0$ 112 at 0 seconds, the state 114 can represent the environment 102 at a later time $t_1$ 116 at 5 seconds, and the state 118 can represent the environment 102 at a later time $t_2$ 120 at 15 seconds. Therefore, in some instances, the times $t_0$ 112, $t_1$ 116, and $t_2$ 120 can be nonsequential (e.g., with an elapsed time in between the times $t_0$ 112, $t_1$ 116, and $t_2$ 120) or the times $t_0$ 112, $t_1$ 116, and $t_2$ 120 can be sequential (e.g., without an elapsed time in between the times $t_0$ 112, $t_1$ 116, and $t_2$ 120).

The vehicle(s) 104 can transmit the log data 108 or a portion of the log data 108 to a computing device(s) 122 via network 124. For example, the vehicle(s) 104 can transmit log data 108 that includes time data, perception data, and/or map data to the computing device(s) 122 to store the log data 108. Examples of data generated by a vehicle that can be included in the log data 108 can be found, for example, in U.S. patent application Ser. No. 15/644,267 titled "Interactions Between Vehicle and Teleoperations System" and filed Jul. 7, 2017 (describing, in part, communication signals that can include sensor data and data indicating an occurrence of an event as well vehicle control data that can be derived from data received from a sensor and a planner, an object data calculator, an object classifier, a collision predictor system, a kinematics calculator, a safety system actuator, and a control operation of the drive system), U.S. patent application Ser. No. 15/693,700 titled "Occupant Protection System Including Expandable Curtain and/or Expandable Bladder" and filed Sep. 1, 2017 (describing, in part, data representative of a trajectory of the vehicle, location data, object data, and vehicle control data), and U.S. patent application Ser. No. 16/198,653 titled "Executable Component Interface and Controller" filed Nov. 21, 2018 (describing, in part, a type of log data), which are each incorporated by reference in their entirety. In some instances, the computing device(s) 122 can include a server that stores the log data 108 in a database. In some instances, the computing device(s) 122 can operate a scenario generator. Such transmission can be wired, wireless, or otherwise, as described in detail herein.

In some instances, the vehicle(s) 104 can be operated remotely by a person. For example, while traversing the environment 102, the vehicle(s) 104 can encounter an event of interest that is unpredictable in nature, represents safety concerns, and/or requires responses to spontaneous visual cues or direction from, for example, police officers or construction workers. The vehicle(s) 104 can be configured to detect that an uncertainty associated with an action (e.g., by determining confidence level(s) associated with a maneuver and/or event). Upon identifying such uncertainty, the vehicle(s) 104 can send a request to a teleoperations device to obtain guidance to resolve the uncertainty and proceed.

Following the request to the teleoperations device, a user interface can quickly and accurately apprise the teleoperator of the situation. In some instances, the vehicle(s) 104 can transmit log data 108 (e.g., sensor data captured by sensors and/or operation state data) with the request. In response to the request, a teleoperator can provide guidance (which may sometimes be referred to as a command, or otherwise information, such as, but not limited to, disregard certain policies, a path to try and follow, or the like) to the vehicle(s) 104. In some instances, the teleoperations device can determine the guidance based at least on the request, sensor data, and/or vehicle state data. In some instances, the vehicle state data can indicate a light status of the vehicle, a door status of the vehicle, a battery status of the vehicle, etc.

The vehicle(s) 104 can be configured to generate an event marker associated with the request to the teleoperations device. In some instances, the vehicle(s) 104 can determine an event of interest and generate an event marker associated with the event of interest without sending a request to the teleoperations device. For purposes of illustration only, the vehicle(s) 104 can use a sensor to detect a sudden braking event. For example, the vehicle(s) 104 can determine that an amount of acceleration meets or exceeds a threshold to detect the sudden braking event. The vehicle(s) 104 can be configured to associate sudden braking events as an event of interest and generate an event marker associated with the sudden braking event. In some instances, the vehicle(s) 104 can generate a log of events of interest in the log data 108 that indicates a type of event of interest as well as a timestamp associated with the event of interest. In some instances, the vehicle(s) 104 can generate an event marker that indicates a time in the log data 108 when the event of interest occurred.

After receiving the log data 108 at the computing device(s) 122, a scenario generator executing on the computing device(s) 122 can determine an event associated with the log data 108. For example, the vehicle(s) 104, while traversing the environment 102, can determine a lane change action as an event of interest. The vehicle(s) 104 can then transmit the log data 108 to the computing device(s) 122. At the computing device(s) 122, the scenario generator can identify the log data 108 that includes an event of interest by, for example, scanning through the log data 108 for an event of interest and/or my identifying an event marker. In some examples, the log data 108 can be sent to the computing device(s) 122 whereby the computing device(s) 122 can search the log data 108 to determine one or more events (e.g., braking associated with a deceleration above a threshold value, pedestrians crossing a crosswalk, navigating around double-parked vehicles, and the like).

Based on the log data 108, the scenario generator can identify objects represented in the log data 108. Then the scenario generator can determine portions of the log data 108 that are associated with the objects. For example, the scenario generator can identify the object 106(1) that is a vehicle in the environment 102 that is represented in the log data 108 at state 110. The scenario generator can identify the object 106(1) that is represented in the log data 108 at states 114 and 118. In some instances, the log data 108 can include perception data associated with the object 106(1) that identifies, for example, an extent of the object 106(1). In some instances, the perception data can include, or can be based on, sensor data from a sensor or a combination of sensors of vehicle(s) 104. In some instances, the log data 108 can include track data associated with the object 106(1) that identifies a movement of the object 106(1) in the environment 102 (e.g., output of data association between subsequent times of data acquisition associating new data with previous data about the object).

Using the perception data and/or the track data, the scenario generator can determine a log data attributes table 126 that identifies attributes associated with one or more objects of the environment 102 at various times of the log data 108. For example, object 1 of the log data attributes table 126 can be object 106(1) and be associated with attributes 128(1), 128(2), and 128(3); object 2 of the log data attributes table 126 can be object 106(2) and be associated with attributes 130(1), 130(2), and 130(3); and object 3 of the log data attributes table 126 can be object 106(3) and be associated with attributes 132(1), 132(2), and 132(3). In some instances, the attributes can indicate one or more extent(s) of the object (e.g., a length, width, height, etc.), a pose of the object, a velocity of the object, a classification of the object, a trajectory of the object, an instantiation attribute of the object, and/or a termination attribute of the object.

In some instances, the instantiation attribute can indicate a manner in which the vehicle(s) 104 detect the object and/or an initial perception of the object. For purposes of illustration only, the object 106(1) can enter a detection range of the vehicle(s) 104 by the vehicle(s) 104 approaching the object 106(1), by the object 106(1) approaching the vehicle(s) 104, and/or the object 106(1) becoming visible (e.g., the object 106(1) can be behind an occluding object such as a building and the vehicle(s) 104 and/or the object 106(1) can move to a position where the occluding object no longer occludes the object 106(1), also referred to as an occlusion cessation). In some instances, the detection range (also referred to as a perception threshold) can be associated with a capability of the one or more sensors of the vehicle(s) 104. In some instances, the detection range can be associated with a confidence value that is determined by a perception engine of the vehicle(s) 104.

In some instances, the termination attribute can indicate a manner in which the vehicle(s) 104 can no longer detect the object and/or an updated perception of the object. For purposes of illustration only, the object 106(1) can be in a position outside of the detection range of the vehicle(s) 104 by the vehicle(s) 104 moving away from the object 106(1), by the object 106(1) moving away from the vehicle(s) 104, and/or the object 106(1) becoming occluded (e.g., the object 106(1) can move to a position behind an occluding object such as a building).

For purposes of illustration only, the log data attributes table 126 can indicate that object 1 traveled at a velocity of 5 meters/second (m/s) at a time $t_0$, traveled at a velocity of 4.8 m/s at a time $t_1$, and traveled at a velocity of 4.5 m/s at a time $t_2$. In some instances, the scenario generator can determine inconsistencies in the log data attributes table 126 and determine estimated attributes associated with an object. For purposes of illustration only, the log data attributes table 126 can indicate that the object 1 traveled at a velocity of 5 meters/second (m/s) at a time $t_0$, traveled at a velocity of 55 m/s at a time $t_1$, and traveled at a velocity of 4.5 m/s at a time $t_2$. The scenario generator can determine that the velocity at $t_1$ is inconsistent and determine an estimated attribute for the velocity of the vehicle at $t_1$.

In some instances, the scenario generator can determine that an attribute is inconsistent based on an attribute threshold. For purposes of illustration only, the scenario generator can determine that a velocity of 55 m/s meets or exceeds a velocity threshold. In some instances, the scenario generator can determine that, for purposes of illustration only, a change in an extent attribute associated with an object exceeds an extent change threshold. In some instances, the scenario generator can determine that an attribute is inconsistent based on an attribute threshold and a different attribute. For purposes of illustration only, the scenario generator can determine that a velocity threshold for a pedestrian classification of an object is lower than the velocity threshold for a vehicle classification for an object. In some instances, the scenario generation can determine that the velocity threshold for a vehicle is higher on a highway road surface than the velocity threshold for a vehicle on a road surface within a school zone. In some instances, the scenario generator can use a standard deviation to determine that an attribute is inconsistent, although other suitable algorithms and techniques are contemplated.

In some instances, the scenario generator can determine an estimated attribute to replace the inconsistent attribute in the log data attributes table 126. In some instances, the scenario generator can generate an estimated attributes table instead of, or in addition to, replacing the values of the log data attributes table 126 The scenario generator can determine an estimated attribute using an estimation algorithm. In some instances, the estimation algorithm can include an averaging algorithm. For purposes of illustration only, the log data attributes table 126 can indicate that the object 1 has a length attribute of 4.5 meters at a time $t_0$, a length attribute of 8 meters at a time $t_1$, and a length attribute of 4.6 meters at a time $t_2$. (Of course, in some examples, an extent attribute may correspond to a width or height, or any combination thereof, and is not limited to length). The scenario generator can determine that the extent attribute associated with the object 1 at $t_1$ is inconsistent and discard and/or ignore the extent attribute and generate an estimated extent attribute by averaging the extent attribute values associated with the object 1 at times $t_0$ and $t_2$ resulting in an estimated length attribute of 4.55 meters and replace the length attribute associated with the object 1 at time $t_1$ with 4.55 meters.

In some instances, the scenario generator can use the estimation algorithm to replace all of the attribute values of a type of attribute associated with an object. For purposes of illustration only, the scenario generator can replace the extent attribute values associated with object 1 at times $t_0$, $t_1$, and $t_2$ with 4.55 meters. As can be understood, in some instances, the length of an object such as a vehicle can be assumed to be consistent in the environment 102 and a simulated environment generated by the scenario generator.

Based on the log data 108, the log data attributes table 126, and/or an estimated attributes table (e.g., described in connection with FIG. 2, as well as throughout this disclosure), the scenario generator can generate simulation instructions 134 that describe a simulated scenario that includes a simulated environment. For example, the log data 108 can include map data and location data indicating a region such as environment 102 and how the vehicle(s) 104 traversed through the region. Additionally, the log data 108 can include status data of the vehicle(s) 104, including but not limited to acceleration data, steering angle data, indicator status data, etc. as the vehicle(s) 104 traversed through the region. The log data 108 can include time data that associates actions of the vehicle(s) 104 and observations (e.g., sensor data) with a set of timestamps. The log data 108 can be used by the scenario generator to generate the simulation instructions 134 that, when executed, can generate simulation data that that represents the environment 102 and include simulated objects at various states. For example, the simulation data can represent a state 136 of the simulated environment at a time $t_x$ 138, a state 140 of the simulated environment at a time $t_y$ 142 that is after the time $t_x$ 138, and a state 144 of the simulated environment at a time $t_z$ 146 that is after the time $t_y$ 142.

In some instances, the scenario generator can create simulation instructions that represent the simulated environment that includes more or less detail from environment 102 as depicted in FIG. 1 (e.g., by filtering out objects or by adding additional objects).

As discussed above, the scenario generator can execute the simulation instructions and generate simulation data. The simulation data can indicate how an autonomous controller associated with a simulated vehicle responded under the circumstances presented in the simulated scenario as well as how the simulated objects responded.

FIG. 2 depicts an example process 200 of generating, based on a log data attributes table 202, an estimated attributes table 204 using an attributes component 206 of a computing device(s) 208. In some instances, the log data attributes table 202 can be similar to the log data attributes table 126 and the computing device(s) can be similar to the computing device(s) 122 described above with respect to FIG. 1.

As described above, a vehicle computing device can generate log data that can include sensor data, perception data, planning data, vehicle status data, velocity data, intent data, and/or other data generated by the vehicle computing device. A scenario generator, based on the log data, can determine the log data attributes table 202 that identifies attributes associated with one or more objects of an environment at various times of log data. As depicted in FIG. 2, and for purposes of illustration only, the log data attributes table 202 can indicate that an object 1 has an length of 5.1 meters at a time $t_0$, a length of 5.2 meters at a time $t_1$, and a length of 0.3 meters at a time $t_2$. Additionally, the log data attributes table can indicate that the object 1 has a classification of a car at a time $t_0$, a classification of a car at a time $t_1$, and a classification of a cyclist at a time $t_2$. In some instances, the log data attributes table 202 can include track data associated with the object. The track data can indicate positions, orientations, and the like of the object and, in some instances, can be used to determine that the object at to is the same object as the object at $t_1$ and at $t_2$.

The attributes component 206 can determine that a change in classification is inconsistent and determine an estimated classification attribute. For purpose of illustration only, the attributes component 206 can determine that for a majority of the times as indicated by the log data attributes table 202, the classification associated with object 1 is a car classification. Based on the majority classification, the attributes component 206 can determine the estimated attribute 210 that identifies the object 1 as a car at time $t_2$. In some instances, the log data attributes table 202 (and/or the log data) can include a confidence value associated with an attribute of an object. For purposes of illustration only, the log data can indicate that object 1 is traveling away from the vehicle that captured/generated the log data. Further, a perception engine of the vehicle can determine a confidence value associated with the classification attribute of the object 1 that decreases as the object 1 travels away from the vehicle. In some instances, the confidence value can fail to meet or exceed a confidence value threshold (e.g., an object confidence threshold) and the attributes component 206 can determine an estimated classification attribute based on the confidence value failing to meet or exceed the confidence value threshold.

As depicted in FIG. 2, and for purposes of illustration only, the log data attributes table 202 can indicate that an object 1 has a velocity of 4.5 m/s at a time $t_0$, a velocity of 4.8 m/s at a time $t_1$, and velocity of 4.5 m/s at a time $t_2$. In some instances, the log data attributes table 202 (and/or the log data) can include pose data, localization data, and/or relative distance data that indicates a position of the object 1 in an environment. The attributes component 206 can determine that the velocity attributes associated with the object 1 in the log data attributes table 202 is inconsistent based on, for example, the position of the object 1 in the environment. For example, the attributes component 206 can determine that if the vehicle traveled at the velocities indicated in the log data attributes table 202, that it would be at a position in the environment that is different from the position indicating by the log data attributes table 202 (and/or the log data). Then, the attributes component 206 can generate estimated velocity attributes associated with the object 1 based on, for example, the position data associated with the object 1.

As discussed above, in some instances, the attributes component 206 can modify the log data attributes table 202 and replace inconsistent attributes with, for example, the estimated attribute 210. In some instances, the attributes component 206 can generate the estimated attributes table 204.

Figure 3:
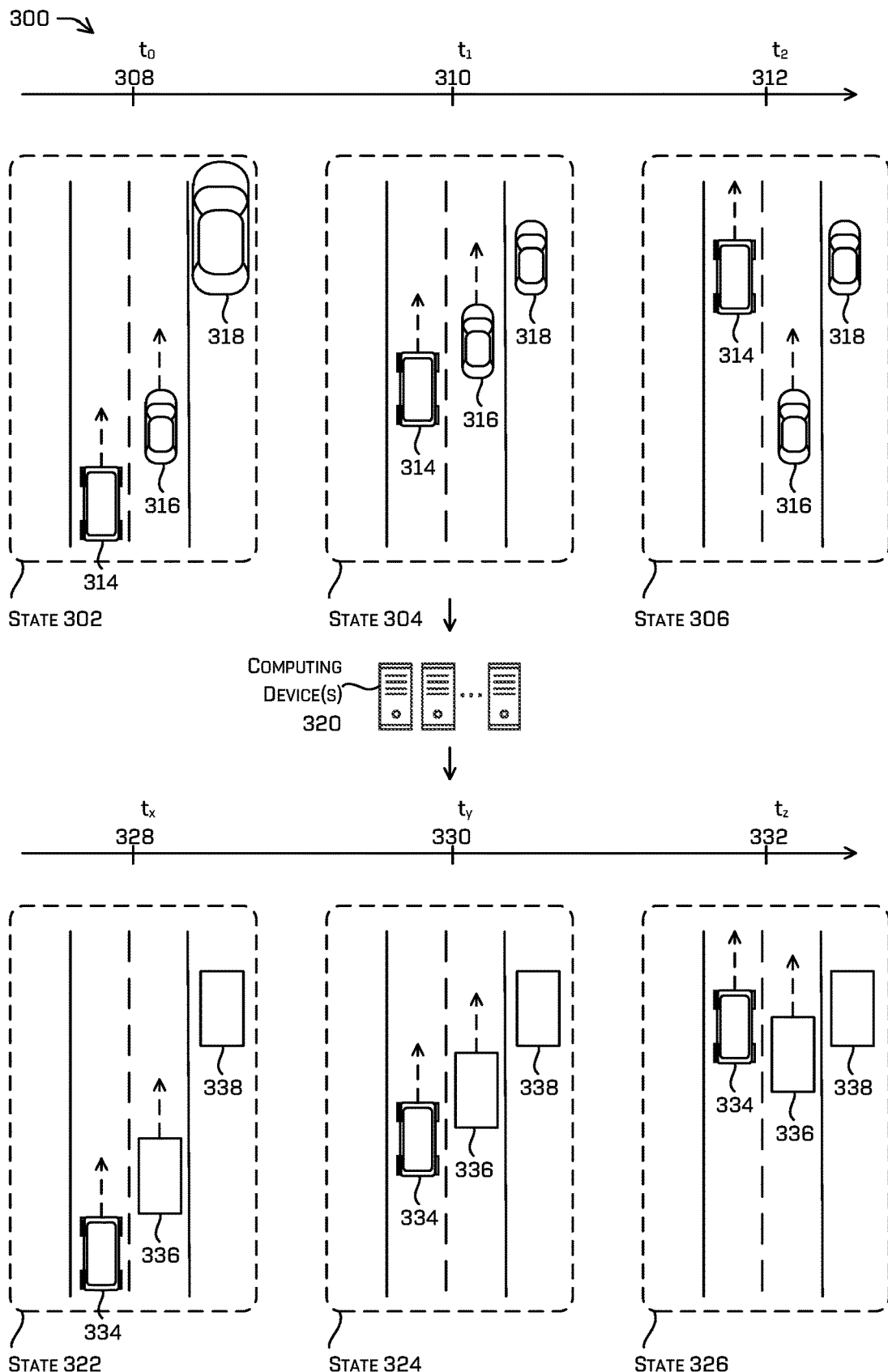
FIG. 3 depicts log data that represents a vehicle and objects in an environment at multiple instances of time and simulation instructions based on the log data that, when executed by a simulator, represent a simulated vehicle and simulated objects in a simulated environment at multiple instances of time.

FIG. 3 illustrates an example 300 that depicts a scenario generator generating an estimated attribute and generating an example scenario using the estimated attribute.

The log data can represent states 302, 304, and 306 of an environment that are associated with times $t_0$ 308, $t_1$ 310, and $t_2$ 312. At a time $t_0$ 308, the state 302 can represent a vehicle 314 as traversing the environment with an object 316 (e.g., a dynamic object such as a different vehicle) in a driving lane to the right of vehicle 314 and an object 318 (e.g., a static object such as a parked vehicle) in a parking lane. At a time $t_1$ 310 that is after time $t_0$, the state 304 can represent the vehicle 314 as traversing the environment and passing object 316. At a time $t_2$ 312 that is after times $t_0$ and $t_1$, the state 306 can represent the vehicle 314 as traversing the environment and completing a pass of object 316. By way of example and without limitation, FIG. 3 depicts object 316 as partially obscuring the vehicle 314 from detecting object 318.

The log data can be transmitting to computing device(s) 320 that is executing a scenario generator. In some instances, the computing device(s) 320 can be similar to the computing device(s) 122 and 208 described above with respect to FIGS. 1 and 2, respectively.

As discussed above, an attributes component, similar to the attributes component 206 described above with respect to FIG. 2, that is executing on the computing device(s) 320 can determine attributes associated with the objects 316 and/or 318. In some instances, an attribute can indicate an extent of the object, a pose of the object, a velocity of the object, a classification of the object, a trajectory of the object, an instantiation attribute of the object, a termination attribute of the object, and the like. In some instances, the attributes component can determine an inconsistency in the attributes associated with the objects 316 and/or 318. As depicted in FIG. 3, and for purposes of illustration only, state 302 can represent the object 318 having a first extent. At state 304, the object 318 can be represented as having a second extent that is different from the first extent. At state 304, the object 318 can be represented as having a third extent that is the same as the second extent but different from the first extent. Additionally, as depicted it FIG. 3 and for purposes of illustration only, the state 304 can represent the object 316 in a first position and the state 306 can represent the object 316 associated with a second position that is behind the first position.

The attributes component can determine that the extent attribute associated with the object 318 is inconsistent. In some instances, the attributes component can use an extent change threshold to determine that the extent attribute is inconsistent. For purposes of illustration only, the extent of the object 318 can decrease from state 302 to state 304 by 50% and the extent change threshold can be 5%. The attributes component can determine that the extent associated with the object 318 has changed by equal to or more than 5% and determine that the extent attribute is inconsistent. In some instances, the attributes component can use a standard deviation to determine that the extent attribute is inconsistent.

In some instances, the attributes component can determine that a position attribute associated with the object 316 is inconsistent. In some instances, the attributes component can determine the position attribute of the object 316 is inconsistent based on the velocity attribute of the object 316. For example, the attributes component can determine that, because the object 316 traveled at the velocities indicated in the log data, that it would be at a position in the environment that is different from the position indicated at state 306.

Then, the attribute component can determine an estimated object attribute (also referred to as an estimated attribute) to replace the inconsistent attribute. The attributes component can determine an estimated attribute using an estimation algorithm such as an averaging algorithm or a mode algorithm (e.g., selecting the most frequently appearing attribute value). The attributes component can determine that the estimated extent of the object 318 can be the extent that is most frequently identified in the log data and use the extent of the object 318 as indicated in states 304 and 306. In some instances, the attributes component can determine the estimated position of the object 316 by using the velocity attribute and the amount of time elapsed (e.g., if the object 316 is traveling with a velocity of 4.2 m/s over the course of two seconds, that the object would be 8.4 meters farther ahead).

The scenario generator can generate simulation instructions, based at least in part on the log data and the estimated attributes, that, when executed by a simulator, can generate simulation data that represents states 322, 324, and 326 of a simulated environment that are associated with times $t_x$ 328, $t_y$ 330, and $t_z$ 332. At a time $t_x$ 328, the state 322 can represent the simulated vehicle 334 as traversing the simulated environment with a simulated object 336 (e.g., a dynamic simulated object such as a different simulated vehicle) in a driving lane to the right of the simulated vehicle 334 and a static simulated object 338 (e.g., a parked simulated vehicle) in a simulated parking lane. At a time $t_y$ 330 that is after time $t_x$, the state 324 can represent the simulated vehicle 334 as traversing the simulated environment and passing simulated object 336. At a time $t_z$ 332 that is after times $t_x$ and $t_y$, the state 326 can represent the simulated vehicle 334 as traversing the simulated environment and completing a pass of simulated object 336.

The simulation data, as depicted in FIG. 3, can represent the extent of the static simulated object 338 as consistent at states 322, 324, and 326. Additionally, the simulation data can represent the position of the simulated object 336 as consistently progressing forward it its trajectory as opposed to being in a position behind a previous position while at a later time as represented in states 304 and 306.

Figure 4:
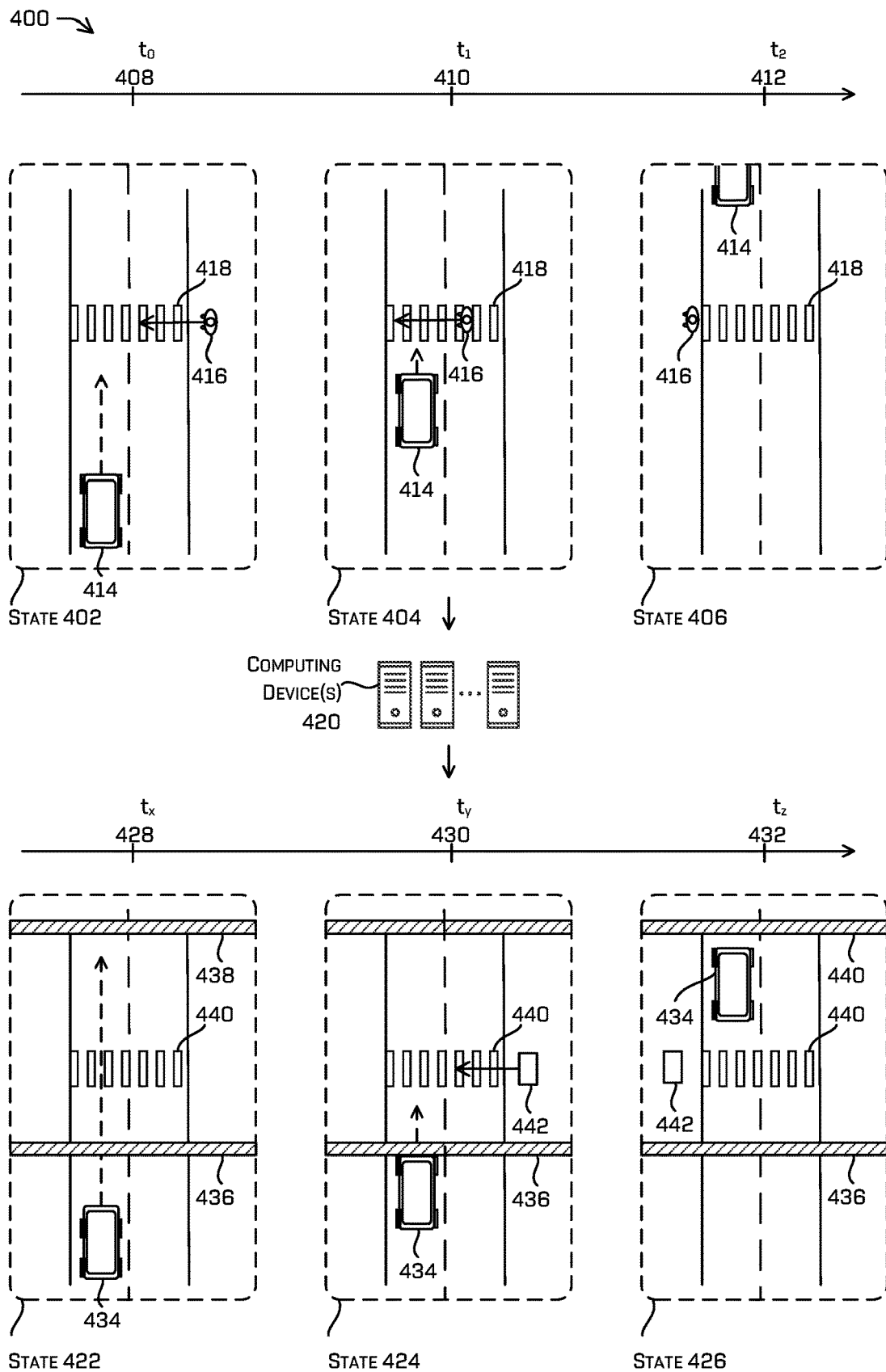
FIG. 4 depicts log data that represents a vehicle and an object in an environment at multiple instances of time and simulation instructions based on the log data that, when executed by a simulator, represent a simulated vehicle and a simulated object in a simulated environment with a trigger region at multiple instances of time.

FIG. 4 illustrates an example 400 that depicts a scenario generator instantiating a simulated object based on a vehicle crossing an instantiation trigger region and destroying the simulated object based on the vehicle crossing a destruction trigger region in a simulated environment.

The log data can represent states 402, 404, and 406 of an environment that are associated with times $t_0$ 408, $t_1$ 410, and $t_2$ 412. At a time $t_0$ 408, the state 402 can represent a vehicle 414 as traversing the environment with an object 416 (e.g., a pedestrian) to the right of vehicle 414 in front of a crosswalk 418. At a time $t_1$ 410 that is after time $t_0$, the state 404 can represent the vehicle 414 as traversing the environment and stopping at the crosswalk 418 to allow the object 416 to cross the crosswalk. At a time $t_2$ 412 that is after times $t_0$ and $t_1$, the state 406 can represent the vehicle 414 as traversing the environment and completing a pass of the crosswalk 418 and the object 416 completing a crossing of the crosswalk 418.

The log data can be transmitted to computing device(s) 420 that is executing a scenario generator. In some instances, the computing device(s) 420 can be similar to the computing device(s) 122, 208, and 320 described above with respect to FIGS. 1, 2, and 3, respectively.

A trigger component that is executing on the computing device(s) 420 can determine an instantiation trigger region (also referred to as an instantiation region) and a destruction trigger region (also referred to as a destruction region) that is associated with an instantiation and a destruction, respectively, of the object 416. For example, the scenario generator can generate simulation instructions, based at least in part on the log data, that, when executed by a simulator, can generate simulation data that represents states 422, 424, and 426 of a simulated environment that are associated with times $t_x$ 428, $t_y$ 430, and $t_z$ 432. At a time $t_x$ 428, the state 422 can represent the simulated vehicle 434 as traversing the simulated environment with an instantiation trigger region 436, a destruction trigger region 438, and a simulated crosswalk 440. The instantiation trigger region 436 and the destruction trigger region 438 can be associated with a simulated object 442. A simulation component that is executing on the computing device(s) 420 can monitor a location of the simulated vehicle 434 to determine when the simulated vehicle 434 will activate/trigger a trigger region. At a time $t_y$ 430 that is after time $t_x$, the state 424 can represent the simulated vehicle 434 as traversing the simulated environment and beginning to cross or activate the instantiation trigger region 436. The scenario generator can, based on the simulated vehicle 434 beginning to cross the trigger region, instantiate the simulated object 442 (e.g., a simulated pedestrian) in front of the simulated crosswalk to the right of simulated vehicle 434. In some instances, the simulated vehicle 434 can change its trajectory based on detecting the simulated object 442 and come to a stop before entering the simulated crosswalk 440.

At a time $t_z$ 432 that is after times $t_x$ and $t_y$, the state 426 can represent the simulated vehicle 434 as traversing the simulated environment after passing the simulated crosswalk 440. Additionally, the state 426 can represent the simulated object 442 that has completed crossing the sidewalk. When the simulated vehicle 434 crosses and/or activates the destruction trigger region 438, the simulation component can destroy/despawn the simulated object 442.

Therefore, the instantiation trigger region 436 can represent a region in a simulated environment that, when interacted with by the simulated vehicle 434 (e.g., crossing the trigger region or being located within a threshold distance of the trigger region), can cause the simulated object 442 to become instantiated in the simulated environment. In some instances, the location of the trigger region can be based on the perception of the object represented in the log data. By way of example and without limitation, the vehicle 414 can traverse an environment and the perception engine of the vehicle 414 can detect that the object 416 is situated to the right of the vehicle 414 at a distance of 50 meters. In some instances, the object 416 can become perceptible to the vehicle 414 due to an occlusion no longer occluding the object 416. The trigger component can, based on the perception range of the perception engine of the vehicle 414, determine the location of the instantiation trigger region 436 based on the distance of 50 meters. In some instances, the trigger component can determine a location of the trigger region based on an average detection range of various sensor modalities.

Similarly, and by way of example and without limitation, the vehicle 414 can traverse the environment and the perception engine of the vehicle 414 can determine that the object 416 is no longer within a perceptible (e.g., visible) range at a distance of 70 meters. In some instances, the object 416 can become no longer perceptible due to the object 416 becoming occluded. The trigger component can, based on the perception range of the vehicle 414, determine the location of the destruction trigger region 438. In some instances, the trigger component can determine the location of the destruction trigger region 438 based on a trajectory associated with the object 416. For example, the trigger component can determine that a trajectory of the object 416 indicates that the object is moving away from the vehicle 414 and will no longer further interact with the vehicle 414 for the purposes of the simulation. Then, based on a perception range associated with the vehicle 414, an amount of time, or any combination thereof, the trigger component can determine a destruction trigger region associated with the simulated object 442.

In some instances, the trigger component can determine a termination trigger region (also referred to as a destruction trigger region or a destruction region) that terminates an object based on the vehicle 414 interacting (e.g., crossing the termination trigger region). In some instances, the trigger component can determine other trigger regions associated with other object attributes and/or actions. For purposes of illustration only, the trigger component can generate a trigger region that is associated with a lane change action of a simulated object.

In some instances, the trigger component can determine a trigger region (e.g., an instantiation trigger region and/or a termination trigger region) based on the perception range of the vehicle 414 and move the trigger region (or determine a different trigger region) based on a simulation interaction/timing change. By way of example and without limitation, the vehicle 414 can traverse the environment and deviate from the log data. The trigger component can determine trigger regions that can cause the vehicle 414 to instantiate an object or destroy an object at an earlier time or a later time to cause the vehicle 414 to interact with the object based on, for example, the deviation.

Figure 5A:
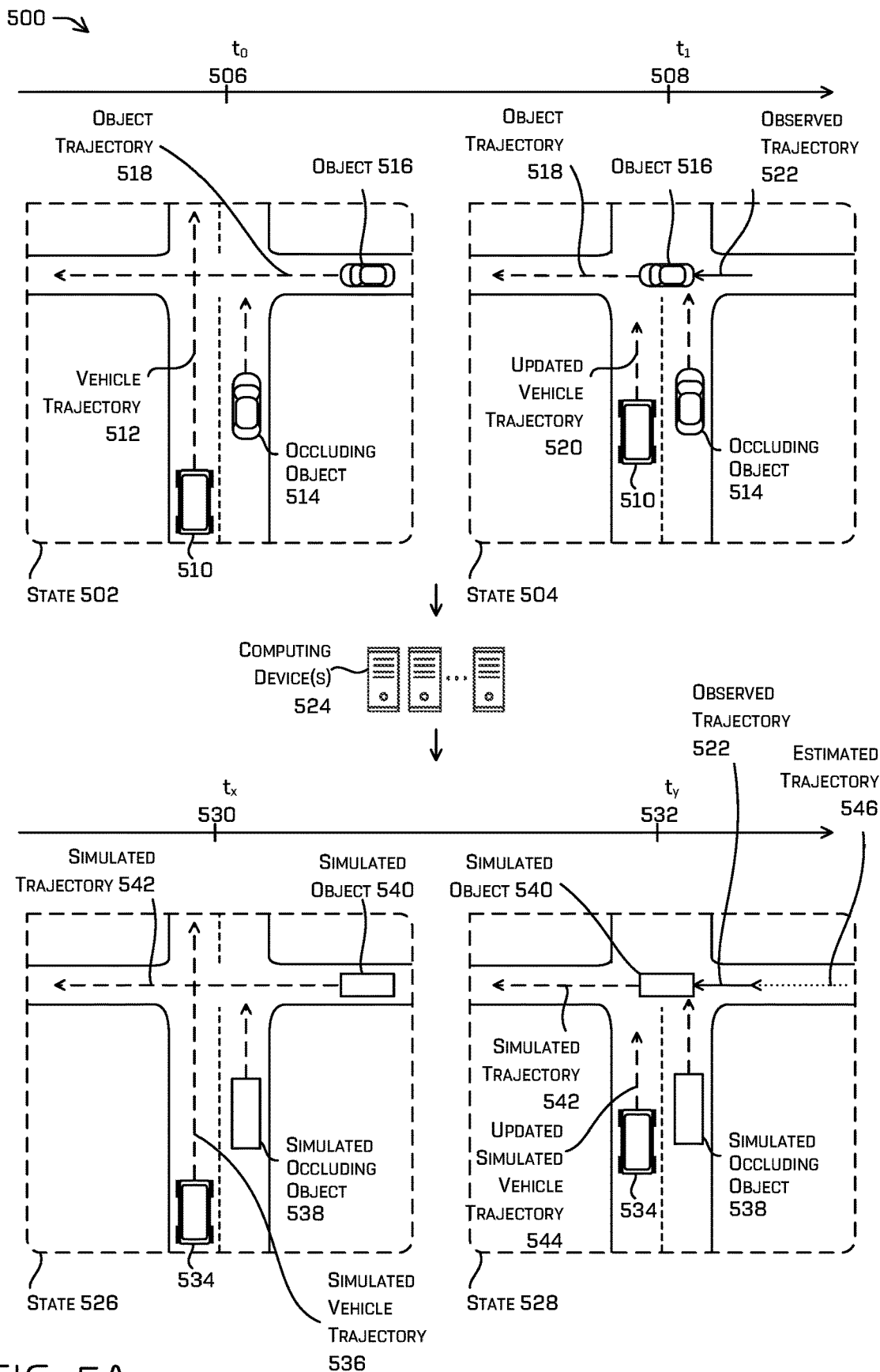
FIG. 5A depicts an example environment that includes a vehicle and an object that becomes visible and an observed trajectory associated with the object and an example simulated environment that includes a simulated vehicle and a simulated object that becomes visible with an observed trajectory and an inferred trajectory.

FIG. 5A illustrates an example 500 that depicts a simulated scenario that includes instantiating a simulated object with an inferred trajectory in a simulated environment.

The log data can represent states 502 and 504 of an environment that are associated with times $t_0$ 506 and $t_1$ 508. At a time $t_0$ 506, the state 502 can represent a vehicle 510 as traversing the environment along a vehicle trajectory 512. The state 502 can also represent an occluding object 514 (e.g., a large, slow-moving vehicle) that occludes a portion of the environment from the vehicle 510. The state 502 can also represent an object 516 that is traversing the environment along an object trajectory 518.

For purposes of illustration only, the placement of the occluding object 514 occludes the portion of the environment such that the vehicle 510 is unable to detect the object 516 the time $t_0$ 506. At a time $t_1$ 508 that is after time $t_0$ 506, the state 504 can represent the vehicle 510 as traversing the environment traversing along an updated vehicle trajectory 520. As the vehicle 510 approaches the intersection depicted in state 504, the vehicle's 510 perception engine can detect the object 516 as crossing in front of the vehicle 510 and, in response, the vehicle 510 can update its trajectory to updated vehicle trajectory 520 which can allow the vehicle to safely slow down and/or come to a stop to prevent a collision which object 516. The log data can indicate that as the object 516 became visible (unoccluded), the vehicle's 510 perception engine could detect a portion of the object's 516 trajectory depicted as the observed trajectory 522 (also referred to as a logged trajectory).

The log data can be transmitted to computing device(s) 524 that is executing a scenario generator. In some instances, the computing device(s) 524 can be similar to the computing device(s) 122, 208, 320, and 420 described above with respect to FIGS. 1, 2, 3, and 4, respectively.

As discussed above, an attributes component, similar to the attributes component 206 described above with respect to FIG. 2, that is executing on the computing device(s) 524 can determine attributes associated with the object 516. In some instances, the attribute can indicate a trajectory associated with the object 516. As depicted in FIG. 5A, and for purposes of illustration only, the scenario generator can generate simulation instructions, based at least in part on the log data, that, when executed by a simulator, can generate simulation data that represents states 526 and 528 of a simulated environment that are associated with times $t_x$ 530 and $t_y$ 532. At a time $t_x$ 530, the state 526 can represent the simulated vehicle 534 as traversing the simulated environment following a simulated vehicle trajectory 536. Similar to state 502, state 526 can include a simulated occluding object 538 as well as simulated object 540 following a simulated trajectory 542. At a time $t_y$ 532 that is after time $t_x$ 530, the state 528 can represent the simulated vehicle 534 as traversing the simulated environment and executing an updated simulated vehicle trajectory 544 based on detecting the simulated object 540 crossing in front of the simulated vehicle 534. Additionally, the attributes component can determine the estimated trajectory 546 of the simulated object 540 despite being occluded by the simulated occluding object 538 during that portion of the simulated object's 540 trajectory. In some instances, determining the estimated trajectory 546 can allow for a more robust testing of the controller associated with the simulated vehicle 534 by removing the simulated occluding object 538 and determining a response by the controller of the simulated vehicle 534. In some instances, the estimated trajectory 546 can allow for the scenario to include a simulated trajectory of the simulated object 540 that represents a trajectory that is not represented in the log data.

In some examples, attributes component 206 can determine waypoint(s) and/or paths associated with the simulated object. By way of example and without limitation, such waypoints or paths can be based at least in part on the log data representing the object corresponding to the simulated object. In some examples, waypoints can be determined based on a curvature of a path segment or can be added manually in a user interface. Such waypoints or paths can be associated with various costs or weights that influence a behavior of the simulated object in the simulated environment. For example, a waypoint can be associated with a position cost or a time cost that enforces a distance or position of the simulated object in the simulated environment. Such waypoints or paths can be associated with events or actions, such as a lane change action, using trigger regions. For example, the log data can indicate that an object performed a lane change action that placed the object to the right of the vehicle. Additionally, the log data can indicate that the vehicle attempted to perform a lane change action to the right but did not complete the action due to the object. In order to preserve this interaction in the simulated scenario, the attributes component 206 can assign a waypoint attribute associated with the trajectory of the simulated object such that the simulated object performs the lane change action and remains on the right side of the simulated vehicle. Controllers associated with the simulated vehicle may then, in such examples, determine controls for the simulated vehicle which adapt to changes in the scenario while minimizing deviations from the paths as originally taken.

Additionally, the attributes component 206 can determine a simulation cost associated with various parameters associated with the simulated vehicle and/or the simulated objects. By way of example and without limitation, and as discussed above, the attributes component 206 can associate a waypoint and/or a path with the simulated object to influence the behavior of the simulated object in the simulated environment. In some cases, motion of the simulated object may be based at least in part on one or more costs, including but not limited to a reference cost (e.g., a cost based on a distance of the simulated object from a reference trajectory, such as the path of the object represented in the log data), an obstacle cost (e.g., a cost based on a distance between the simulated object and other object(s) in the simulated environment), an acceleration cost (e.g., a cost associated with speeding up or slowing down, such as maximum and/or minimum acceleration(s)), and/or a steering cost (e.g., a cost based on steering angle(s) of the simulated object, which may or may not be based on a velocity of the simulated object), although other costs are contemplated. The controller of the simulated object can determine an alternate trajectory (also referred to as a candidate trajectory) and have an associated simulation cost. In some instances, a first trajectory can be associated with a simulation cost that is higher than a second trajectory and the planner can determine to execute the trajectory associated with a lower simulation cost.

In some instances, the attributes component 206 can associate weights to various vehicle parameters, waypoints, trajectories, and the like. For purposes of illustration only, and as discussed above, the simulated object can have a simulation cost associated with a first trajectory associated with a waypoint that places the simulated object to the right of the simulated vehicle. Additionally, the simulated object can determine a second trajectory that does not place the simulated object to the right of the simulated vehicle. A weight can be assigned to the first trajectory and/or the second trajectory. For example, the purpose of the simulation can be to determine how the simulated vehicle responds when the simulated object is to the right of the simulated vehicle. A user can adjust the weight associated with the first trajectory and assign it a weight that is significantly higher than the weight assigned to other trajectories. In some instances, a trajectory associated with a higher cost can still be the trajectory traversed by a simulated object if the weight is sufficient to overcome the cost difference with other trajectories associated with a lower cost. In such examples, weighting may be indicative of how much a simulated vehicle's trajectory can differ from an associated previously recorded trajectory.

Therefore, the simulated vehicle 534, and the simulated object 540, can perform actions that differ from the actions associated with the vehicle 510 in the log data and the estimated trajectory 546 can allow for the simulated vehicle 534 to detect the simulated object 540 at a location associated with the estimated trajectory 546. By way of example and without limitation, the simulated vehicle 534 can traverse along the simulated vehicle trajectory 536 at a higher velocity which can allow the simulated vehicle 534 to detect the simulated object 540 as the simulated object traverses along the estimated trajectory 546 and before the observed trajectory 522.

In some instances, the estimated trajectory 546 can be determined based on a trigger region. As discussed above, waypoints and/or paths can be associated with events and/or actions. A trigger region can be associated with a waypoint such as to direct a trajectory of a simulated object upon an activation of a trigger region. As discussed above, in some instances, a trigger region can be an instantiation trigger region where when the simulated vehicle 534 crosses or activates the instantiation trigger region, a simulation component can instantiation a simulated object (e.g., simulated object 540). In some instances, the simulated vehicle 534 can activate the instantiation trigger region at a portion of the simulation that precedes the observed trajectory 522. Thus, the estimated trajectory 546 can indicate a location (e.g., a location along the estimated trajectory 546) to instantiate the simulated object 540. In some instances, the simulation component can instantiate the simulated object 540 based on the estimated trajectory 546 as well as a perception range associated with the simulated vehicle 534.

Figure 5B:
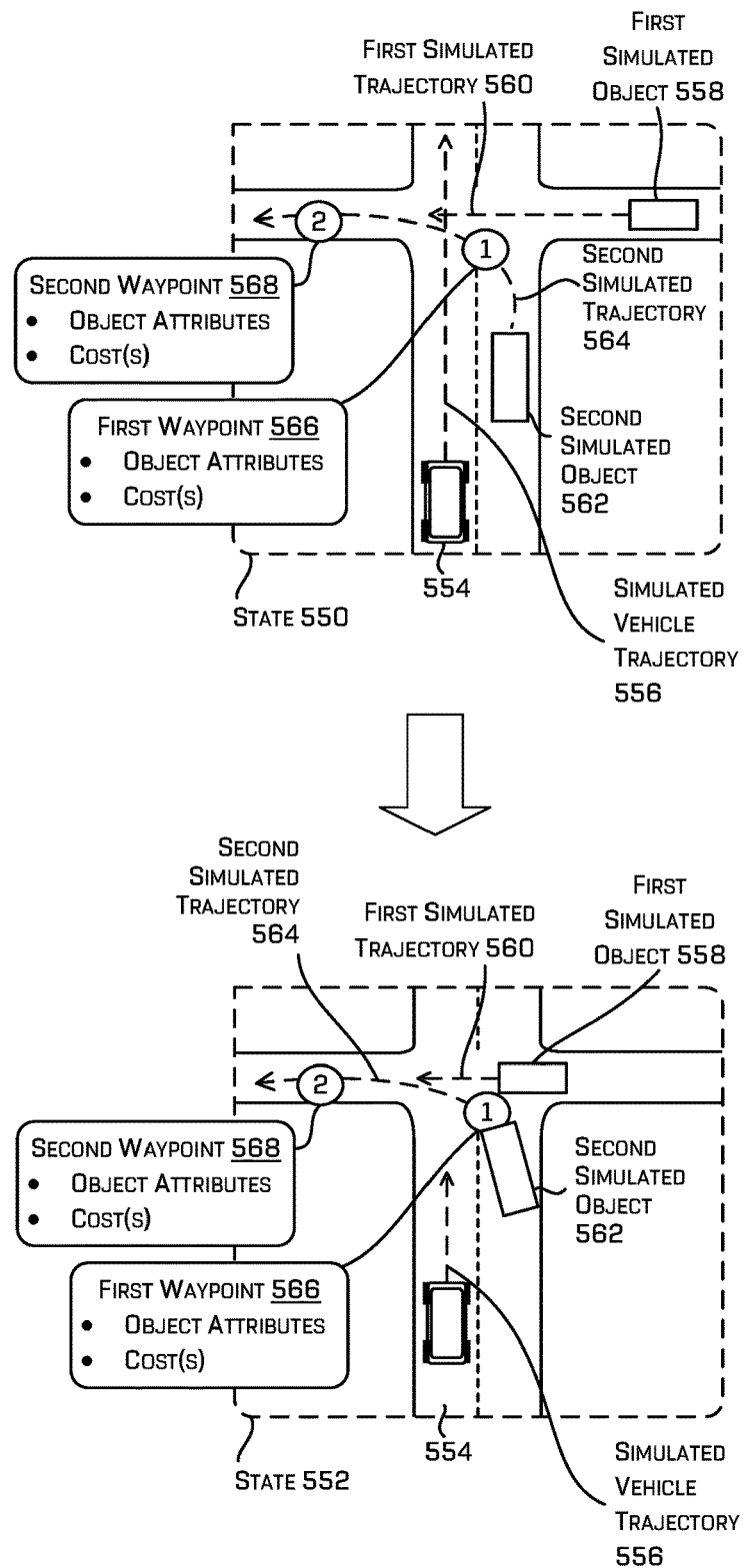
FIG. 5B depicts an example simulated environment that includes a simulated vehicle traversing an environment with a first simulated object traversing a first simulated trajectory and a second simulated object traversing a second simulated trajectory with waypoints associated with the second simulated trajectory.

FIG. 5B depicts an example 548 that depicts a simulated scenario with simulated objects and waypoints associated with a simulated trajectory of a simulated object. at a state 550 and a state 552 that follows a period of time after state 550. FIG. 5B includes numbering such as ①, ②, ③, etc. This numbering is intended to orient a reader to one possible order of operations, but is not intended to be construed as a limitation, as discussed herein.

At state 550, the simulated vehicle 554 traverses a simulated environment while following a simulated vehicle trajectory 556. A first simulated object 558 is following a first simulated trajectory 560 and a second simulated object 562 is following a second simulated trajectory 564. The second simulated trajectory 564 can be associated with a first waypoint 566 at location ① and a second waypoint 568 at location ②. As discussed above, the attributes component 206 can determine waypoint(s) ① and ② associated with the second simulated object 562 along the second simulated trajectory 564.

When determining the simulated scenario, the attributes component 206 can determine a trajectory that respects or otherwise represents the attributes associated with the waypoints 566 and/or 568 (e.g., by minimizing a difference between a trajectory of the object in simulation and the observed trajectory of the object). For example, at state 552, the second simulated object 562 can traverse the simulated environment such that, when the second simulated object 562 reaches the first waypoint 566, the behavior of the second simulated object 562 can be substantially similar (at least in part and within a threshold) to the attributes associated with the first waypoint 566.

For example, the object attributes can include a speed, a steering angle, yaw rate, acceleration, classification, predicted trajectory, uncertainty, and/or other object parameters. Additionally, cost(s) that indicates a simulation cost (e.g., a reference, cost, an obstacle cost, an acceleration cost, and/or a steering cost) can be determined for the first waypoint 566. For example, cost(s) can be determined based at least in part on object attributes (e.g., a speed, a steering angle, yaw rate, acceleration, classification, predicted trajectory, uncertainty, and/or other object parameters) associated with the second simulated trajectory 564. In some instances, the first waypoint 566 can be associated with a threshold such that if determined cost(s) meet or exceed a threshold, the second simulated trajectory 564 can be rejected or modified to determine an updated trajectory with cost(s) that do not exceed the threshold. Similarly, when the second simulated object 562 reaches the second waypoint 568, the behavior of the second simulated object 562 has parameters substantially similar (at least in part and within some threshold) to the attributes associated with the object attributes of the second waypoint 568.

As depicted in FIG. 5B, the second simulated object 562 can be traversing along the second simulated trajectory 564 that can interfere with the first simulated trajectory 560 that is associated with the first simulated object 558. By way of example and without limitation, based on the cost associated with the second waypoint 568, a deviation of the second simulated object 562 from reaching the second waypoint 568 can be high enough such that the second simulated object 562 will continue along the second simulated trajectory 564 and attempt to cut in front of the first simulated object 558. In some instances, a deviation of the second simulated object 562 from reaching the second waypoint 568 can be low enough such that the second simulated object 562 will halt along the second simulated trajectory 564 to avoid a potential collision between the second simulated object 562 and the first simulated object 558.

Figure 6:
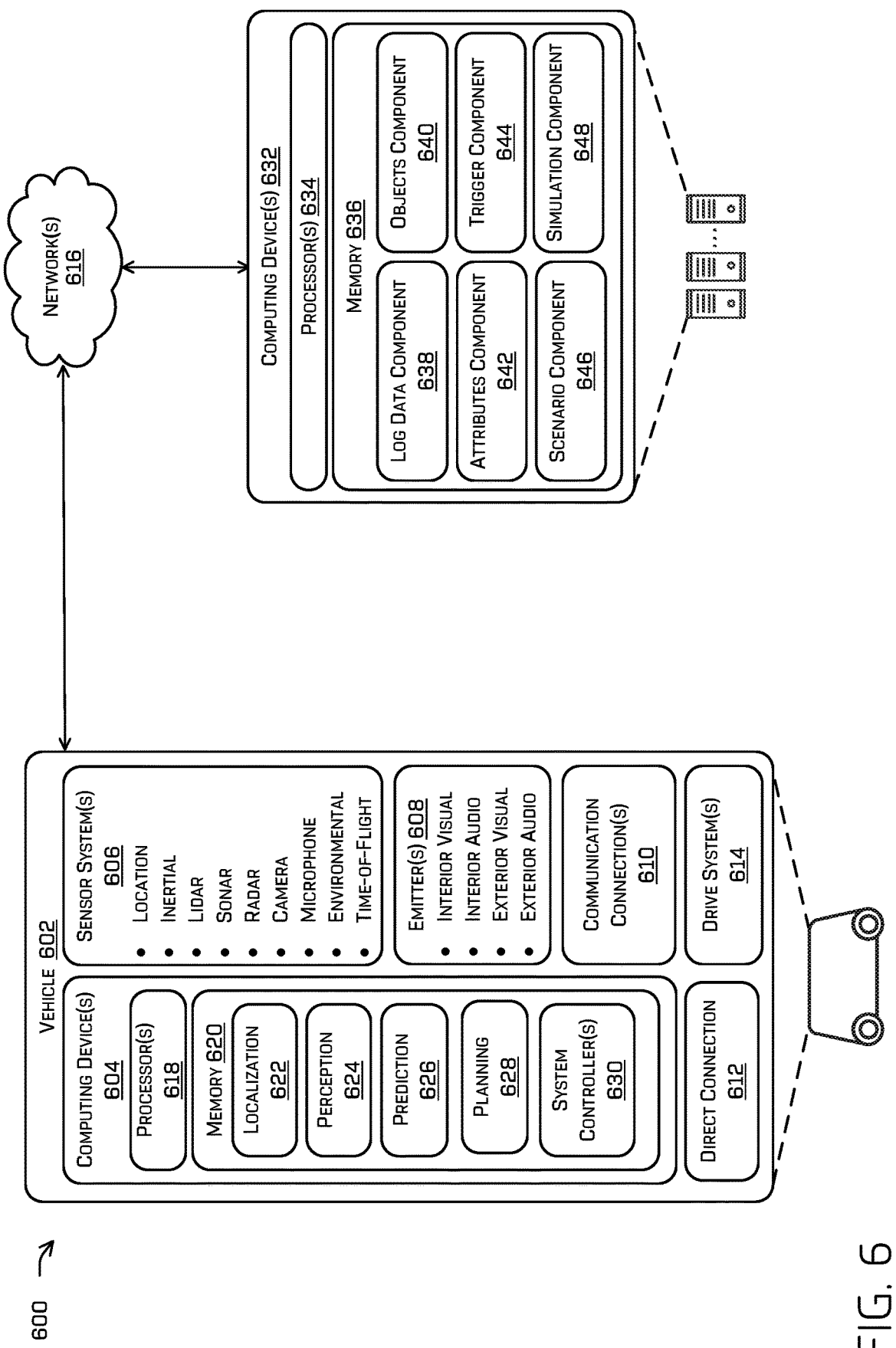
FIG. 6 depicts a block diagram of an example system for implementing the techniques described herein.

FIG. 6 depicts a block diagram of an example system 600 for implementing the techniques discussed herein. In at least one example, the example system 600 can include a vehicle 602, which can be similar to the vehicle(s) 104 described above with reference to FIG. 1. In the illustrated example system 600, the vehicle 602 is an autonomous vehicle; however, the vehicle 602 can be any other type of vehicle.

The vehicle 602 can be a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such examples, because the vehicle 602 can be configured to control all functions from start to completion of the trip, including all parking functions, it may not include a driver and/or controls for driving the vehicle 602, such as a steering wheel, an acceleration pedal, and/or a brake pedal. This is merely an example, and the systems and methods described herein may be incorporated into any ground-borne, airborne, or water-borne vehicle, including those ranging from vehicles that need to be manually controlled by a driver at all times, to those that are partially or fully autonomously controlled.

The vehicle 602 can be any configuration of vehicle, such as, for example, a van, a sport utility vehicle, a cross-over vehicle, a truck, a bus, an agricultural vehicle, and/or a construction vehicle. The vehicle 602 can be powered by one or more internal combustion engines, one or more electric motors, hydrogen power, any combination thereof, and/or any other suitable power sources. Although the vehicle 602 has four wheels, the systems and methods described herein can be incorporated into vehicles having fewer or a greater number of wheels, and/or tires. The vehicle 602 can have four-wheel steering and can operate generally with equal or similar performance characteristics in all directions, for example, such that a first end of the vehicle 602 is the front end of the vehicle 602 when traveling in a first direction, and such that the first end becomes the rear end of the vehicle 602 when traveling in the opposite direction. Similarly, a second end of the vehicle 602 is the front end of the vehicle when traveling in the second direction, and such that the second end becomes the rear end of the vehicle 602 when traveling in the opposite direction. These example characteristics may facilitate greater maneuverability, for example, in small spaces or crowded environments, such as parking lots and/or urban areas.

The vehicle 602 can include a computing device(s) 604, one or more sensor system(s) 606, one or more emitter(s) 608, one or more communication connection(s) 610 (also referred to as communication devices and/or modems), at least one direct connection 612 (e.g., for physically coupling with the vehicle 602 to exchange data and/or to provide power), and one or more drive system(s) 614. The one or more sensor system(s) 606 can be configured to capture sensor data associated with an environment.

The sensor system(s) 606 can include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor system(s) 606 can include multiple instances of each of these or other types of sensors. For instance, the time-of-flight sensors can include individual time-of-flight sensors located at the corners, front, back, sides, and/or top of the vehicle 602. As another example, the camera sensors can include multiple cameras disposed at various locations about the exterior and/or interior of the vehicle 602. The sensor system(s) 606 can provide input to the computing device(s) 604.

The vehicle 602 can also include one or more emitter(s) 608 for emitting light and/or sound. The one or more emitter(s) 608 in this example include interior audio and visual emitters to communicate with passengers of the vehicle 602. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 608 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle 602 can also include one or more communication connection(s) 610 that enable communication between the vehicle 602 and one or more other local or remote computing device(s) (e.g., a remote teleoperations computing device) or remote services. For instance, the communication connection(s) 610 can facilitate communication with other local computing device(s) on the vehicle 602 and/or the drive system(s) 614. Also, the communication connection(s) 610 can allow the vehicle 602 to communicate with other nearby computing device(s) (e.g., other nearby vehicles, traffic signals, etc.).

The communications connection(s) 610 can include physical and/or logical interfaces for connecting the computing device(s) 604 to another computing device or one or more external networks 616 (e.g., the Internet). For example, the communications connection(s) 610 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s). In at least some examples, the communication connection(s) 610 may comprise the one or more modems as described in detail above.

In at least one example, the vehicle 602 can include one or more drive system(s) 614. In some examples, the vehicle 602 can have a single drive system 614. In at least one example, if the vehicle 602 has multiple drive systems 614, individual drive systems 614 can be positioned on opposite ends of the vehicle 602 (e.g., the front and the rear, etc.). In at least one example, the drive system(s) 614 can include one or more sensor system(s) 606 to detect conditions of the drive system(s) 614 and/or the surroundings of the vehicle 602. By way of example and not limitation, the sensor system(s) 606 can include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders can be unique to the drive system(s) 614. In some cases, the sensor system(s) 606 on the drive system(s) 614 can overlap or supplement corresponding systems of the vehicle 602 (e.g., sensor system(s) 606).

The drive system(s) 614 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 614 can include a drive system controller which can receive and preprocess data from the sensor system(s) 606 and to control operation of the various vehicle systems. In some examples, the drive system controller can include one or more processor(s) and memory communicatively coupled with the one or more processor(s). The memory can store one or more modules to perform various functionalities of the drive system(s) 614. Furthermore, the drive system(s) 614 also include one or more communication connection(s) that enable communication by the respective drive system with one or more other local or remote computing device(s).

The computing device(s) 604 can be similar to the vehicle computing device described above with reference to FIG. 1. The computing device(s) 604 can include one or more processor(s) 618 and memory 620 communicatively coupled with the one or more processor(s) 618. In the illustrated example, the memory 620 of the computing device(s) 604 stores a localization component 622, a perception component 624, a prediction component 626, a planning component 628, and one or more system controller(s) 630. Though depicted as residing in the memory 620 for illustrative purposes, it is contemplated that the localization component 622, the perception component 624, the prediction component 626, the planning component 628, and the one or more system controller(s) 630 can additionally, or alternatively, be accessible to the computing device(s) 604 (e.g., stored in a different component of vehicle 602 and/or be accessible to the vehicle 602 (e.g., stored remotely).

In memory 620 of the computing device(s) 604, the localization component 622 can include functionality to receive data from the sensor system(s) 606 to determine a position of the vehicle 602. For example, the localization component 622 can include and/or request/receive a three-dimensional map of an environment and can continuously determine a location of the autonomous vehicle within the map. In some instances, the localization component 622 can use SLAM (simultaneous localization and mapping) or CLAMS (calibration, localization and mapping, simultaneously) to receive time-of-flight data, image data, lidar data, radar data, sonar data, IMU data, GPS data, wheel encoder data, or any combination thereof, and the like to accurately determine a location of the autonomous vehicle. In some instances, the localization component 622 can provide data to various components of the vehicle 602 to determine an initial position of an autonomous vehicle for generating a trajectory, as discussed herein.

The perception component 624 can include functionality to perform object detection, segmentation, and/or classification. In some examples, the perception component 624 can provide processed sensor data that indicates a presence of an entity that is proximate to the vehicle 602 and/or a classification of the entity as an entity type (e.g., car, pedestrian, cyclist, building, tree, road surface, curb, sidewalk, unknown, etc.). In additional and/or alternative examples, the perception component 624 can provide processed sensor data that indicates one or more characteristics associated with a detected entity and/or the environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc.

The perception component 624 can include functionality to store perception data generated by the perception component 624. In some instances, the perception component 624 can determine a track corresponding to an object that has been classified as an object type. For purposes of illustration only, the perception component 624, using sensor system(s) 606 can capture one or more images of an environment. The sensor system(s) 606 can capture images of an environment that includes an object, such as a pedestrian. The pedestrian can be at a first position at a time T and at a second position at time T+t (e.g., movement during a span of time t after time T). In other words, the pedestrian can move during this time span from the first position to the second position. Such movement can, for example, be logged as stored perception data associated with the object.

The stored perception data can, in some examples, include fused perception data captured by the vehicle. Fused perception data can include a fusion or other combination of sensor data from sensor system(s) 606, such as image sensors, lidar sensors, radar sensors, time-of-flight sensors, sonar sensors, global positioning system sensors, internal sensors, and/or any combination of these. The stored perception data can additionally or alternatively include classification data including semantic classifications of objects (e.g., pedestrians, vehicles, buildings, road surfaces, etc.) represented in the sensor data. The stored perception data can additionally or alternatively include a track data (positions, orientations, sensor features, etc.) corresponding to motion of objects classified as dynamic objects through the environment. The track data can include multiple tracks of multiple different objects over time. This track data can be mined to identify images of certain types of objects (e.g., pedestrians, animals, etc.) at times when the object is stationary (e.g., standing still) or moving (e.g., walking, running, etc.). In this example, the computing device determines a track corresponding to a pedestrian.

The prediction component 626 can generate one or more probability maps representing prediction probabilities of possible locations of one or more objects in an environment. For example, the prediction component 626 can generate one or more probability maps for vehicles, pedestrians, animals, and the like within a threshold distance from the vehicle 602. In some instances, the prediction component 626 can measure a track of an object and generate a discretized prediction probability map, a heat map, a probability distribution, a discretized probability distribution, and/or a trajectory for the object based on observed and predicted behavior. In some instances, the one or more probability maps can represent an intent of the one or more objects in the environment.

The planning component 628 can determine a path for the vehicle 602 to follow to traverse through an environment. For example, the planning component 628 can determine various routes and paths and various levels of detail. In some instances, the planning component 628 can determine a route to travel from a first location (e.g., a current location) to a second location (e.g., a target location). For the purpose of this discussion, a route can be a sequence of waypoints for traveling between two locations. As non-limiting examples, waypoints include streets, intersections, global positioning system (GPS) coordinates, etc. Further, the planning component 628 can generate an instruction for guiding the autonomous vehicle along at least a portion of the route from the first location to the second location. In at least one example, the planning component 628 can determine how to guide the autonomous vehicle from a first waypoint in the sequence of waypoints to a second waypoint in the sequence of waypoints. In some examples, the instruction can be a path, or a portion of a path. In some examples, multiple paths can be substantially simultaneously generated (i.e., within technical tolerances) in accordance with a receding horizon technique. A single path of the multiple paths in a receding data horizon having the highest confidence level may be selected to operate the vehicle.

In other examples, the planning component 628 can alternatively, or additionally, use data from the perception component 624 to determine a path for the vehicle 602 to follow to traverse through an environment. For example, the planning component 628 can receive data from the perception component 624 regarding objects associated with an environment. Using this data, the planning component 628 can determine a route to travel from a first location (e.g., a current location) to a second location (e.g., a target location) to avoid objects in an environment. In at least some examples, such a planning component 628 may determine there is no such collision free path and, in turn, provide a path which brings vehicle 602 to a safe stop avoiding all collisions and/or otherwise mitigating damage.

In at least one example, the computing device(s) 604 can include one or more system controller(s) 630, which can be configured to control steering, propulsion, braking, safety, emitters, communication, and other systems of the vehicle 602. These system controller(s) 630 can communicate with and/or control corresponding systems of the drive system(s) 614 and/or other components of the vehicle 602, which may be configured to operate in accordance with a path provided from the planning component 628.

The vehicle 602 can connect to computing device(s) 632 via network(s) 616 and can include one or more processor(s) 634 and memory 636 communicatively coupled with the one or more processor(s) 634. In at least one instance, the one or more processor(s) 634 can be similar to the processor(s) 618 and the memory 636 can be similar to the memory 620. In the illustrated example, the memory 636 of the computing device(s) 632 stores a log data component 638, an objects component 640, an attributes component 642, a triggering component 644, a scenario component 646, and a simulation component 648. Though depicted as residing in the memory 636 for illustrative purposes, it is contemplated that the log data component 638, the objects component 640, the attributes component 642, the trigger component 644, the scenario component 646, and the simulation component 648 can additionally, or alternatively, be accessible to the computing device(s) 632 (e.g., stored in a different component of computing device(s) 632 and/or be accessible to the computing device(s) 632 (e.g., stored remotely).

In the memory 636 of the computing device(s) 632, the log data component 638 can determine log data to be used for generating a simulated scenario. As discussed above, a database can store one or more log data. In some instances, the computing device(s) 632 can act as the database to store the log data. In some instances, the computing device(s) 632 can connect to a different computing device to access the log data database. The log data component 638 can to scan log data stored in the database and identify log data that contains an event of interest. As discussed above, in some instances, the log data can include an event marker that indicates that an event of interest is associated with a particular log data. In some instances, a user can select a log data of a set of log data to be used to generate a simulated scenario.

Additionally, the objects component 640 can identify one or more objects associated with the log data. For example, the objects component 640 can determine objects such as vehicles, pedestrians, animals, cyclists, trees, etc. in the log data and represented as simulated objects. In some instances, the objects component 640 can determine objects that interact with the vehicle associated with the log data. For purposes of illustration only, the objects component 640 can determine that an object traversed along a trajectory that began 100 meters from the vehicle and continued to traverse the environment in a direction that is away from the vehicle.

The objects component 640 can determine not to incorporate that object into the simulated scenario as it did not interact with the vehicle and would not provide valuable testing/validation data.

The attributes component 642 can determine attributes associated with an object. For example, an attribute can include an object extent (also referred to as an object size, which may represent a length, width, height, and/or volume), an object classification, an object pose, an object trajectory, an object waypoint, an object instantiation attribute, and/or an object termination attribute.

As discussed above, the object extent can indicate a size and/or volume of the object (e.g., a length of 0.5 meters). The object classification can indicate a classification and/or type of the object (e.g., a vehicle, a pedestrian, a bicyclist, etc.). The object pose can indicate an object's x-y-z coordinates (e.g., a position or position data) in the environment and/or can include a pitch, a roll, and/or a yaw associated with the object. The object trajectory can indicate a trajectory followed by the object. The object waypoint can indicate a position in the environment that indicates a route between two locations.

In some instances, the attributes component 642 can filter objects based on filters to remove or discard portions of the log data. In some instances, the attributes component 642 can use an extent-based filter such that objects that are associated with an extent that does not meet or exceed the extent-based filter are removed and/or discarded from the log data. In some instances, the attributes component 642 can filter objects that do not meet or exceed a confidence threshold. By way of example and without limitation, the log data can indicate that an object is associated with a classification attribute of a pedestrian and a confidence value of associated with the classification of 5%. The attributes component 642 can have a confidence value threshold of 75% and filter the object based on the confidence value not meeting or exceeding the confidence value threshold. Examples of filters that can be used to remove and/or discard portions of the log data can be found, for example, in U.S. patent application Ser. No. 16/392,094 titled "Scenario Editor and Simulator" and filed Apr. 23, 2019 (describing methods of filtering one or more objects represented in log data based on parameters/attributes associated with the one or more objects).

The object instantiation attribute can indicate how the vehicle detected the object. For example, the object can enter a detection range of the vehicle by: (1) the vehicle approaching the object, (2) the object approaching the vehicle, and/or (3) the object becoming visible (unoccluded) or an occlusion cessation of the object. The object termination attribute can indicate how the vehicle can no longer detect the object. For example, the object can be in a position outside of the detection range of the vehicle by: (1) the vehicle moving away from the object, (2) the object moving away from the vehicle, and/or (3) the object becoming occluded or an occlusion of the object.

The attributes component 642 can determine object attributes for none, some, or all of the objects to be included in the simulated scenario. The attributes component 642 can use the determined object attributes to identify the inconsistencies in the log data. As discussed above, the attributes component 642 can use algorithms and/or techniques based on thresholds, standard deviation calculations, and/or other algorithms such as Z-Score, Dbscan, and/or Isolation Forests.

Additionally, the attributes component 642 can be configured to determine estimated attribute values and replace inconsistent attribute values using algorithms and/or techniques such as mean algorithms, median algorithms, mode algorithms, and/or other smoothing algorithms such as Additive smoothing, Butterworth filters, Chebyshev filters, Exponential smoothing, Kalman filters, Kernal smoothers, Local regression, and/or moving averages, etc.

The trigger component 644 can determine a trigger region associated with a simulated object. In some examples, the trigger region can correspond to a region of the environment that, when a simulated object (such as a simulated autonomous vehicle) is located within a threshold distance of, the simulated object can be instantiated or removed (e.g., destroyed) from the scenario, as discussed herein. For example, the log data can indicate that the vehicle detected a pedestrian at a particular distance ahead of the vehicle as the vehicle traversed along a trajectory. The scenario generator can determine a trigger region based on the distance and instantiate the simulated pedestrian in the simulated environment when the simulated vehicle reaches the trigger region. In some instances, the scenario generator can determine a trigger region to increase a likelihood of interaction with an object. In some instances, the trigger region can cause an action of a simulated object (e.g., when activated, cause an object to perform a lane change action).

In some instances, the trigger component 644 can determine an instantiation trigger region associated with multiple objects. By way of example and without limitation, the trigger component 644 can determine an instantiation trigger region such that when a simulated vehicle crosses the instantiation trigger region, a simulated pedestrian object is instantiated on a sidewalk 75 meters in front of the simulated vehicle and a simulated oncoming vehicle object is instantiated in an opposing traffic 100 meters in front of the simulated vehicle.

In some instances, the trigger component 644 can determine multiple trigger regions associated with a single object. By way of example and without limitation, a first region can be an instantiation trigger region associated with instantiating a simulated object when activated by a simulated vehicle. Additionally, a second region can be an action trigger region associated with causing the simulated object to perform an action (e.g., cause a simulated pedestrian to begin to cross the street at a crosswalk).

In some instances, the trigger component 644 can determine a trigger event associated with the simulated vehicle and/or simulated objects that cause an instantiation, a destruction, and/or an action of another object. By way of example and without limitation, the trigger component 644 can determine a trigger event associated with the simulated vehicle based on the simulated vehicle enabling an indicator to initiate a lane change action. The simulation component 648, as discussed in further detail below, can determine that enabling the indicator triggers an event associated with a simulated object in a lane adjacent to the simulated vehicle to accelerate. By way of an additional example and without limitation, a trigger event can be associated with a simulated object that when the simulated object passes a crosswalk, a simulated pedestrian will begin crossing the crosswalk.

The scenario component 646 can use the log data identified by the log data component 638 to generate a simulated scenario. The simulated scenario includes a simulated environment (e.g., roadways, road markers, buildings, etc.) and simulated objects (e.g., other vehicles, pedestrians, cyclists, animals, etc.). In some instances, the scenario component 646 can use the perception data generated by the perception component 624 to apply simulated object models to the simulated objects. For example, the scenario component 646 can identify a simulated vehicle model and apply it to the simulated objects associated with vehicles. In some instances, the scenario component 646 can identify a simulated pedestrian model and apply it to the simulated objects associated with pedestrians. In some instances, the simulated object models can use controllers that allow the simulated objects to react to the simulated environment and other simulated objects (e.g., modeling physics-based behaviors and incorporating collision checking). For example, a simulated vehicle object can stop at a crosswalk if a simulated pedestrian crosses the crosswalk as to prevent the simulated vehicle from colliding with the simulated pedestrian.

In some instances, the scenario component 646 can identify a simulated pedestrian model and apply it to the simulated objects associated with pedestrians. In some instances, the simulated object models can use controllers that allow the simulated objects to react to the simulated environment and other simulated objects (e.g., modeling physics-based behaviors and incorporating collision checking). For example, a simulated vehicle object can stop at a crosswalk if a simulated pedestrian crosses the crosswalk as to prevent the simulated vehicle from colliding with the simulated pedestrian.

In some instances, the log data can indicate that a particular object has a characteristic and apply that characteristic to the simulated object. For purposes of illustration only, the log data can indicate that an object travels at approximately 10 mph below the speed limit and accelerates slowly. The scenario component 646 can determine that the object is a cautious vehicle and apply a cautious object model to the corresponding simulated object in the simulated environment. In some instances, the scenario component 646 can determine, based on behavior data in the log data, that an object as an aggressive object, a passive object, a neutral object, and/or other types of behaviors and apply behavior instructions associated with the behavior (e.g., a passive behavior, a cautious behavior, a neutral behavior, and/or an aggressive behavior) to the simulated object.

In some instances, the scenario component 646 can use filters to remove objects represented in the log data from a simulated scenario based on attributes associated with the objects. In some instances, the scenario component 646 can filter objects based on an object/classification type (car, pedestrian, motorcycle, bicyclist, etc.), an object size (e.g., length, width, height, and/or volume), a confidence level, track length, an amount of interaction between the object and a vehicle generating the log data, and/or a time period.

By way of example and without limitation, the log data can include objects of varying sizes such as mailboxes and buildings. The scenario component 646 can use a volume-based filter such that objects that are associated with a volume greater equal to or greater than a threshold volume of three cubic meters, such as buildings, are represented in the simulated scenario and objects that are associated with a volume less than three cubic meters are not represented in the simulated scenario, such as the mailboxes. In some instances, the scenario component 646 can use a track length filter where objects that have track lengths (e.g., data associated with a physical distance or a period of time) that do not meet or exceed a track length threshold are filtered from the simulated scenario. This can result in a simulated scenario that omits objects associated with poor detections during the time of data capture. In some instances, the scenario component 646 can use a motion-based filter such that objects associated with motion or a trajectory according to the log data are represented in the simulated scenario. In some instances, the filters can be applied in combination or mutually exclusively.

In some instances, the scenario component 646 can filter objects that do not meet or exceed a confidence threshold. By way of example and without limitation, the log data can indicate that an object is associated with a classification attribute of a pedestrian and a confidence value of associated with the classification of 5%. The scenario component 646 can have a confidence value threshold of 75% and filter the object based on the confidence value not meeting or exceeding the confidence value threshold. In some instances, a user can provide a user-generated filter that includes one or more attribute thresholds such that the scenario component 646 can filter objects that do not meet or exceed the one or more attribute thresholds indicated by the user-generated filter.

The simulation component 648 can execute the simulated scenario as a set of simulation instructions and generate simulation data. In some instances, the simulation component 648 can execute multiple simulated scenarios simultaneously and/or in parallel. This can allow a user to edit a simulated scenario and execute permutations of the simulated scenario with variations between each simulated scenario.

Additionally, the simulation component 648 can determine an outcome for the simulated scenario. For example, the simulation component 648 can execute the scenario for use in a simulation for testing and validation. The simulation component 648 generate the simulation data indicating how the autonomous controller performed (e.g., responded) and can compare the simulation data to a predetermined outcome and/or determine if any predetermined rules/assertions were broken/triggered.

In some instances, the predetermined rules/assertions can be based on the simulated scenario (e.g., traffic rules regarding crosswalks can be enabled based on a crosswalk scenario or traffic rules regarding crossing a lane marker can be disabled for a stalled vehicle scenario). In some instances, the simulation component 648 can enable and disable rules/assertions dynamically as the simulation progresses. For example, as a simulated object approaches a school zone, rules/assertions related to school zones can be enabled and disabled as the simulated object departs from the school zone. In some instances, the rules/assertions can include comfort metrics that relate to, for example, how quickly an object can accelerate given the simulated scenario.

Based at least in part on determining that the autonomous controller performed consistent with the predetermined outcome (that is, the autonomous controller did everything it was supposed to do) and/or determining that a rule was not broken or an assertion was not triggered, the simulation component 648 can determine that the autonomous controller succeeded. Based at least in part on determining that the autonomous controller performance was inconsistent with the predetermined outcome (that is, the autonomous controller did something that it wasn't supposed to do) and/or determining that a rule was broken or than an assertion was triggered, the simulation component 648 can determine that the autonomous controller failed. Accordingly, based at least in part on executing the simulated scenario, simulation data can indicate how the autonomous controller responds to each simulated scenario, as described above and determine a successful outcome or an unsuccessful outcome based at least in part on the simulation data.

The processor(s) 618 of the computing device(s) 604 and the processor(s) 634 of the computing device(s) 632 can be any suitable processor capable of executing instructions to process data and perform operations as described herein. By way of example and not limitation, the processor(s) 618 and 634 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 620 computing device(s) 604 and the memory 636 of the computing device(s) 632 are examples of non-transitory computer-readable media. The memory 620 and 636 can store an operating system and one or more software applications, instructions, programs, and/or data to implement the methods described herein and the functions attributed to the various systems. In various implementations, the memory 620 and 636 can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

In some instances, aspects of some or all of the components discussed herein can include any models, algorithms, and/or machine learning algorithms. For example, in some instances, the components in the memory 620 and 636 can be implemented as a neural network.

Figure 7:
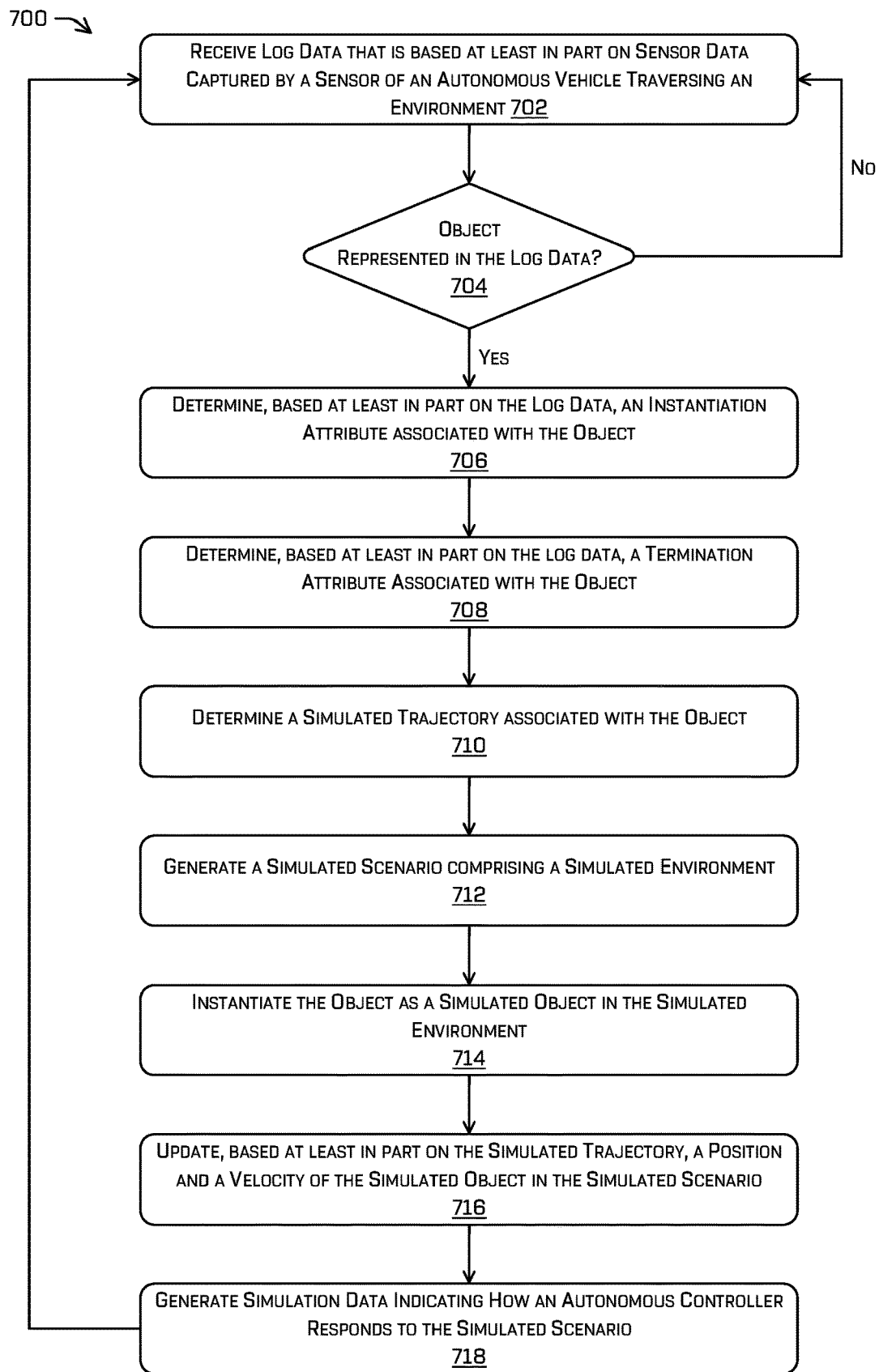
FIG. 7 depicts an example process for generating simulation data based on log data captured by a vehicle traversing an environment.

FIG. 7 depicts an example process 700 for executing the simulation instructions and generating simulation data. In some instances, some or all of example process 700 can be performed by one or more components in FIG. 6, as described herein. The example process 700 is described with reference to the vehicle 602 and the computing device(s) 632 in FIG. 6. Additionally, some portions of example process 700 can be omitted, replaced, and/or reordered while still providing the functionality of determining whether a computing device should remain in a standby state.

At operation 702, the log data component 638 can receive the log data of an autonomous vehicle traversing an environment. In some instances, the log data component 638 can identify log data within a database that stores a plurality of log data.

At operation 704, the example process 700 continues by determining if an object is represented in the log data. In some instances, the object can be the vehicle 602 that generated the log data. In some instances, the object can be an object in the environment that is distinct from the vehicle 602. In at least some examples, log data may include, for example, track data, object detections, and the like such that determination may be performed on the log data directly.

At operation 706, the attributes component 642 can determine, based at least in part on the log data, an instantiation attribute associated with the object. For example, the instantiation attribute can indicate that, in the log data, the vehicle approached the object, the object approached the vehicle, and/or the object became visible to be detected by a sensor and/or a perception system of the vehicle. In some instances, the trigger region can be associated with the instantiation attribute. The trigger component 644 can determine a location of an instantiation trigger region (e.g., based on a perception range associated with the vehicle and/or based on when an object was detected in an environment in log data) and when a simulated vehicle activates the instantiation trigger region in a simulated environment (e.g., by traversing over the instantiation trigger region), a simulated object can be instantiated in the simulated environment (e.g., based on the perception range associated with the vehicle and/or a location of the simulated vehicle in the simulated environment).

At operation 708, the attributes component 642 can determine, based at least in part on the log data, a termination attribute associated with the object. For example, the termination attribute can indicate that, in the log data, the vehicle traversed away from the object, that the object traversed away from the vehicle, and/or that the object became occluded and could not be detected by a sensor and/or a perception system of the vehicle. In some instances, the trigger component 644 can determine a location of a destruction trigger region (e.g., based on the perception range associated with the vehicle). When a simulated vehicle activates the destruction trigger region in a simulated environment (e.g., by traversing over the destruction trigger region), the simulated object can be destroyed/despawned (e.g., based on the perception range associated with the vehicle and/or a location of the simulated vehicle in the simulated environment).

At operation 710, the attributes component 642 can determine a simulated trajectory associated with the object. The simulated trajectory can be based on the trajectory attribute of the object that indicates the trajectory represented in the log file. As discussed above, the attributes component 642 can determine waypoint(s) and/or paths associated with the simulated object to determine the simulated trajectory associated with the object. By way of example and without limitation, such waypoints or paths can be based at least in part on the log data representing the object corresponding to the simulated object. In some examples, waypoints can be determined based on a curvature of a path segment or can be added manually in a user interface. Such waypoints or paths can be associated with various costs or weights that influence a behavior (e.g., trajectory) of the simulated object in the simulated environment.

At operation 712, the scenario component 646 can generate the simulation instructions that, when executed by a simulator, can generate simulation data that represents a response of a vehicle controller operating in the simulated environment. The simulation instructions can describe, for example, a placement of objects in a simulated environment, a trajectory for one or more objects, and trigger regions associated with an instantiation of objects, etc.

At operation 714, the simulation component 648 can execute the simulation instructions and instantiate the object as a simulated object in the simulated environment. In some instances, the simulation component 648 can instantiate the simulated object based on a trigger region associated with the simulated object.

At operation 716, the simulation component 648 can update a position and velocity of the simulated object. As discussed above, the simulated object can update the position and velocity of the simulated object based on attributes determined by the attributes component 642. In some instances, a position and/or velocity of a simulated object can be updated based on a control of the simulated object using an object controller. The object controller can determine an object state and adjust a control of the object to update the simulated object's position and/or velocity.

At operation 718, the simulation component 648 can generate simulation data that can indicate how an autonomous controller responds to the simulated scenario. In some instances, the simulation component 648 can determine an outcome for the based on the simulation data. For example, the simulation component 648 can execute the scenario for use in a testing and validation of the autonomous controller. The simulation component 648 can generate the simulation data indicating how the autonomous controller performed (e.g., responded) and can compare the simulation data to a predetermined outcome and/or determine if any predetermined rules/assertions were broken/triggered.

In some instances, the predetermined rules/assertions can be based on the simulated scenario (e.g., traffic rules regarding crosswalks can be enabled based on a crosswalk scenario or traffic rules regarding crossing a lane marker can be disabled for a stalled vehicle scenario). In some instances, the simulation component 648 can enable and disable rules/assertions dynamically as the simulation progresses. For example, as a simulated object approaches a school zone, rules/assertions related to school zones can be enabled and disabled as the simulated object departs from the school zone. In some instances, the rules/assertions can include comfort metrics that relate to, for example, how quickly an object can accelerate given the simulated scenario.

Based at least in part on determining that the autonomous controller performed consistent with the predetermined outcome (that is, the autonomous controller did everything it was supposed to do) and/or determining that a rule was not broken or an assertion was not triggered, the simulation component 648 can determine that the autonomous controller succeeded. Based at least in part on determining that the autonomous controller performance was inconsistent with the predetermined outcome (that is, the autonomous controller did something that it wasn't supposed to do) and/or determining that a rule was broken or than an assertion was triggered, the simulation component 648 can determine that the autonomous controller failed. Accordingly, based at least in part on executing the simulated scenario, simulation data can indicate how the autonomous controller responds to each simulated scenario, as described above and determine a successful outcome or an unsuccessful outcome based at least in part on the simulation data.

Accordingly, the techniques discussed herein provide a robust implementation of a scenario editor and simulator to allow for robust simulation of autonomous vehicles increasing the safety of the vehicles.

Example Clauses

A: A system comprising: one or more processors; and one or more computer-readable media storing computer-executable instructions that, when executed, cause the one or more processors to perform operations comprising: receiving log data comprising sensor data generated by a sensor of an autonomous vehicle traversing an environment; determining, based at least in part on the log data, a first object attribute of an object represented in the log data, the first object attribute associated with a first portion of the log data; determining, based at least in part on the log data, a second object attribute of the object associated with a second portion of the log data; determining, based at least in part on the first object attribute and the second object attribute, an updated object attribute; generating a simulated scenario comprising a simulated environment; instantiating, based at least in part on the updated object attribute, the object as a simulated object in the simulated environment; and generating simulation data indicating how an autonomous controller responds to the simulated scenario.

B: The system of paragraph A, the operations further comprising: determining, based at least in part on the log data, an instantiation attribute of the object associated with a third portion of the log data, the instantiation attribute indicating an initial perception of the object; and determining, based at least in part on the log data, a destruction attribute of the object associated with a fourth portion of the log data, the destruction attribute indicating an updated perception of the object.

C: The system of paragraph B, wherein: the instantiation attribute is associated with at least one of: the object entering a perception range of the autonomous vehicle; or a first time associated with detecting the object in the environment; and the destruction attribute is associated with at least one of: the object departing the perception range of the autonomous vehicle; or a second time associated with the object being occluded.

D: The system of paragraph B, the operations further comprising: determining an instantiation trigger region in the simulated environment, the instantiation trigger region associated with the instantiation attribute; and determining a destruction trigger region in the simulated environment, the destruction trigger region associated with the termination attribute, wherein instantiating the object is based at least in part on the autonomous controller reaching a region associated with the instantiation trigger region.

E: The system of paragraph A, wherein determining the simulated trajectory comprises: determining, based at least in part on the log data, a logged trajectory associated with the object; determining, based at least in part on the log data, a classification and a pose of the object; and determining, based at least in part on the logged trajectory, the classification, and the pose, at least one of a simulated velocity or a simulated position of the object.

F: A method comprising: receiving data that is based at least in part on sensor data captured by a sensor in an environment; determining, based at least in part on the data, a first attribute value associated with the object, the first attribute value comprising at least one of an object size, an object classification, an object pose, an object trajectory, or an object waypoint; determining, based at least in part on the first attribute value, an updated attribute value, the updated attribute value comprising at least one of an updated object size, an updated object classification, an updated object pose, an updated object trajectory, or an updated object waypoint; generating a simulated environment; instantiating a simulated autonomous vehicle in the simulated environment; instantiating, based at least in part on the updated attribute value, the object as a simulated object in the simulated environment; and controlling, based at least in part on an autonomous vehicle controller, the simulated autonomous vehicle.

G: The method of paragraph F, wherein the first attribute value is associated with the object at a first time, the method further comprising: determining, based at least in part on the data, a second attribute value associated with the object at a second time after the first time, wherein determining the updated attribute value is further based at least in part on the second attribute value.

H: The method of paragraph F, further comprising: determining, based at least in part on the data, a trigger region in the simulated environment associated with the first attribute value, wherein instantiating the object as the simulated object is based at least in part on the trigger region and a position of the simulated autonomous vehicle.

I: The method of paragraph F, wherein: the sensor is associated with a vehicle; the first attribute value is associated with a first portion of the data indicating a first location in which the vehicle detects the object; and the second attribute value is associated with a second portion of the data indicating a second location in which vehicle stops detecting the object.

J: The method of paragraph F, further comprising: determining, based at least in part on the data, a confidence value associated with a classification of the object, wherein instantiating the object as the simulated object is further based at least in part on the confidence value meeting or exceeding an object confidence threshold.

K: The method of paragraph F, further comprising: determining, based at least in part on the data, a logged trajectory associated with the object; and determining, based at least in part on the updated attribute value and the logged trajectory, a simulated trajectory associated with the object.

L: The method of paragraph F, further comprising: determining, based at least in part on the data, a trajectory associated with the simulated object; and determining, based at least in part on the data and the trajectory, a waypoint comprising an associated waypoint attribute, the associated waypoint attribute indicating at least one of: a waypoint position, a waypoint velocity, a waypoint acceleration, or a waypoint time.

M: A non-transitory computer-readable medium storing instructions executable by a processor, wherein the instructions, when executed, cause the processor to perform operations comprising: receiving data that is based at least in part on sensor data captured by a sensor in an environment, the data comprising information about an object in the environment; determining, based at least in part on the data, a first attribute value associated with the object, wherein the first attribute value is associated with a first portion of the data indicating a first location in which the sensor detects the object; generating a simulated environment; instantiating a simulated autonomous vehicle in the simulated environment; instantiating, based at least in part on the first attribute value and a position of the simulated autonomous vehicle, the object as a simulated object in the simulated environment; and controlling, based at least in part on an autonomous vehicle controller, the simulated autonomous vehicle.

N: The non-transitory computer-readable medium of paragraph M, wherein the first attribute value is associated with the object at a first time, the operations further comprising: determining, based at least in part on the data, a second attribute value associated with the object at a second time after the first time; and determining an updated attribute value based at least in part on the first attribute value and the second attribute value.

O: The non-transitory computer-readable medium of paragraph N, the operations further comprising: determining, based at least in part on the data, a logged trajectory associated with the object; and determining, based at least in part on the updated object attribute and the logged trajectory, a simulated trajectory associated with the object.

P: The non-transitory computer-readable medium of paragraph M, the operations further comprising: determining, based at least in part on the data, a trigger region in the simulated environment associated with the first attribute value, wherein instantiating the object as the simulated object is based at least in part on the trigger region and the position of the simulated autonomous vehicle.

Q: The non-transitory computer-readable medium of paragraph M, the operations further comprising: determining a second attribute value associated with the object, the second attribute value associated with a second portion of the data indicating a second location in which sensor stops detecting the object.

R: The non-transitory computer-readable medium of paragraph P, the operations further comprising: determining, based at least in part on the data, a logged trajectory associated with the object; determining an estimated trajectory; and determining, based at least in part the logged trajectory and the estimated trajectory, a simulated trajectory associated with the simulated object.

S: The non-transitory computer-readable medium of paragraph M, the operations further comprising: determining, based at least in part on the data, a confidence value associated with the first attribute value, wherein instantiating the object as the simulated object is further based at least in part on the confidence value meeting or exceeding an object confidence threshold.

T: The non-transitory computer-readable medium of paragraph M, the operations further comprising: determining, based at least in part on the data, a trajectory associated with the simulated object; and determining, based at least in part on the data and the trajectory, a waypoint comprising an associated waypoint attribute, the associated waypoint attribute indicating at least one of: a waypoint position, a waypoint velocity, a waypoint acceleration, or a waypoint time.

U: A system comprising: one or more processors; and one or more computer-readable media storing computer-executable instructions that, when executed, cause the one or more processors to perform operations comprising: receiving simulation instructions associated with log data that is generated by an autonomous vehicle traversing an environment; generating, based at least in part on the simulation instructions, a simulated scenario comprising a simulated environment; generating, based at least in part on the simulation instructions, an instantiation region that is associated with a simulated object in the simulated environment, the simulated object associated with an object that is represented in the log data; determining a position associated with a simulated autonomous vehicle traversing the simulated environment; instantiating, based at least in part on determining that the position is associated with the instantiation region, the simulated object in the simulated environment; determining, based at least in part on the simulation instructions, an initial trajectory associated with the simulated object; determining a waypoint associated with the initial trajectory; determining a simulation cost associated with the waypoint; controlling, based at least in part on a simulated object controller and the initial trajectory, the simulated object; and controlling, based at least in part on an autonomous vehicle controller, the simulated autonomous vehicle.

V: The system of paragraph U, wherein controlling the simulated object comprises: generating a candidate trajectory associated with the simulated object; determining a candidate cost that indicates a difference between the waypoint and the candidate trajectory; and modifying the candidate trajectory to minimize the candidate cost.

W: The system of paragraph V, wherein the position is a first position, the operations further comprising: determining a second position associated with the simulated autonomous vehicle, wherein generating the candidate trajectory is based at least in part on the second position.

X: The system of paragraph V, wherein the difference is a first difference, and wherein the waypoint is associated with a simulated object attribute comprising at least one of: an object position; an object velocity; an object acceleration; or an object arrival time, and wherein determining the candidate cost comprises: determining a second difference between the simulated object attribute and the candidate trajectory.

Y: The system of paragraph U, wherein the position is a first position, the operations further comprising: determining a second position associated with the simulated autonomous vehicle; generating, based at least in part on the simulation instructions, a destruction region that is associated with the simulated object in the simulated environment; and destroying, based at least in part on determining that the second position is associated with the destruction region, the simulated object.

Z: A method comprising: receiving log data that is generated by a vehicle traversing an environment; generating, based at least in part on the log data, a simulated scenario comprising a simulated environment; generating, based at least in part on the scenario data, an instantiation region that is associated with a simulated object in the simulated environment; instantiating, based at least in part the instantiation region and a position of a simulated vehicle, the simulated object; determining a waypoint associated with the simulated object; determining a simulation cost associated with the waypoint; controlling, based at least in part on a simulated object controller and the waypoint, the simulated object; and controlling, based at least in part on an autonomous vehicle controller, the simulated vehicle.

AA: The method of paragraph Z, wherein instantiating the simulated object comprises: determining the position of the simulated vehicle; and determining that the position is within the instantiation region.

AB: The method of paragraph Z, wherein controlling the simulated object comprises: generating a candidate trajectory associated with the simulated object; determining a candidate cost that indicates a difference between the waypoint and the candidate trajectory; and modifying the candidate trajectory to minimize the candidate cost.

AC: The method of paragraph AB, further comprising: determining an attribute associated with the simulated vehicle; and wherein generating the candidate trajectory is based at least in part on the attribute.

AD: The method of paragraph AC, wherein the attributes comprise at least one of: a vehicle position; a vehicle velocity; a vehicle acceleration; or a vehicle action.

AE: The method of paragraph AB, wherein the difference is a first difference, and wherein the waypoint is associated with a simulated object attribute comprising at least one of: an object position; an object velocity; an object acceleration; or an object arrival time, and wherein determining the candidate cost comprises: determining a second difference between the set simulated object attribute and the candidate trajectory.

AF: The method of paragraph Z, wherein the position is a first position, the method further comprising: determining a second position associated with the simulated vehicle; generating, based at least in part on the log data, a destruction region that is associated with the simulated object; and destroying, based at least in part on the destruction region and the second position, the simulated object.

AG: A non-transitory computer-readable medium storing instructions executable by a processor, wherein the instructions, when executed, cause the processor to perform operations comprising: receiving data that is based at least in part on sensor data captured by a vehicle traversing an environment; generating, based at least in part on the data, a simulated scenario comprising a simulated environment; determining, based at least in part on the data, a region that is associated with a simulated object in the simulated environment; instantiating, based at least in part the region and a position of a simulated vehicle, the simulated object; determining a waypoint associated with the simulated object; controlling, based at least in part on a simulated object controller and the waypoint, the simulated object; and controlling, based at least in part on a vehicle controller, the simulated vehicle.

AH: The non-transitory computer-readable medium of paragraph AG, wherein instantiating the simulated object comprises: determining the position associated with the simulated vehicle; and determining that the position is within the region.

AI: The non-transitory computer-readable medium of paragraph AG, wherein controlling the simulated object comprises: generating a candidate trajectory associated with the simulated object; determining a candidate cost that indicates a difference between the waypoint and the candidate trajectory; and modifying the candidate trajectory to reduce the candidate cost.

AJ: The non-transitory computer-readable medium of paragraph AI, the operations further comprising: determining an attribute associated with the simulated vehicle; and wherein generating the candidate trajectory is based at least in part on the attribute.

AK: The non-transitory computer-readable medium of paragraph AJ, wherein the attribute comprises at least one of: a vehicle position; a vehicle velocity; a vehicle acceleration; or a vehicle action.

AL: The non-transitory computer-readable medium of paragraph AI, wherein: the difference is a first difference; the waypoint is associated with a simulated object attribute comprising at least one of: an object position; an object velocity; an object acceleration; or an object arrival time, and determining the candidate cost comprises: determining a second difference between the simulated object attribute and the candidate trajectory.

AM: The non-transitory computer-readable medium of paragraph AG, wherein the region is a first region, the operations further comprising: determining a second region that is associated with the simulated object; and destroying, based at least in part on the second region, the simulated object.

AN: The non-transitory computer-readable medium of paragraph AM, wherein the position is a first position, and wherein determining the second region comprises: determining at least one of a: a second position of the simulated vehicle; a third position of the simulated object; or a classification associated with the simulated object.

While the example clauses described above are described with respect to one particular implementation, it should be understood that, in the context of this document, the content of the example clauses can also be implemented via a method, device, system, computer-readable medium, and/or another implementation. Additionally, any of examples A-AN may be implemented alone or in combination with any other one or more of the examples A-AN.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A system comprising:
one or more processors; and
one or more computer-readable media storing computer-executable instructions that, when executed, cause the one or more processors to perform operations comprising:
receiving simulation instructions associated with log data that is generated by an autonomous vehicle traversing an environment;
generating, based at least in part on the simulation instructions, a simulated scenario comprising a simulated environment;
generating, based at least in part on the simulation instructions, an instantiation region that is associated with a simulated object in the simulated environment, the simulated object associated with an object that is represented in the log data;
determining, based at least in part on the log data, a termination attribute associated with the simulated object;
determining a position associated with a simulated autonomous vehicle traversing the simulated environment;
instantiating, based at least in part on determining that the position is associated with the instantiation region and independent of the log data, the simulated object in the simulated environment;
determining, based at least in part on the simulation instructions, an initial trajectory associated with the simulated object;
determining a waypoint associated with the initial trajectory;
determining a simulation cost associated with the waypoint;
controlling, based at least in part on a simulated object controller, the initial trajectory, the simulation cost, and the termination attribute, the simulated object in the simulated environment; and
controlling, based at least in part on simulation data that represents a response of an autonomous vehicle controller operating in the simulated environment, the simulated autonomous vehicle in the simulated environment.

2. The system of claim 1, wherein controlling the simulated object comprises:
generating a candidate trajectory associated with the simulated object;
determining a candidate cost that indicates a difference between the waypoint and the candidate trajectory; and
modifying the candidate trajectory to minimize the candidate cost.

3. The system of claim 2, wherein the position is a first position, the operations further comprising:
determining a second position associated with the simulated autonomous vehicle,
wherein generating the candidate trajectory is based at least in part on the second position.

4. The system of claim 2, wherein the difference is a first difference, and wherein the waypoint is associated with a simulated object attribute comprising at least one of:
an object position;
an object velocity;
an object acceleration; or
an object arrival time, and
wherein determining the candidate cost comprises:
determining a second difference between the simulated object attribute and the candidate trajectory.

5. The system of claim 1, wherein the position is a first position, the operations further comprising:
determining a second position associated with the simulated autonomous vehicle;
generating, based at least in part on the simulation instructions, a destruction region that is associated with the simulated object in the simulated environment; and
destroying, based at least in part on determining that the second position is associated with the destruction region, the simulated object.

6. A method comprising:
receiving log data that is generated by a vehicle traversing an environment;
generating, based at least in part on the log data, a simulated scenario comprising a simulated environment;
generating, based at least in part on the log data, an instantiation region that is associated with a simulated object in the simulated environment;
determining, based at least in part on the log data, a termination attribute associated with the simulated object,
instantiating, based at least in part the instantiation region and a position of a simulated vehicle and independent of the log data, the simulated object;
determining a waypoint associated with the simulated object;
determining a simulation cost associated with the waypoint;
controlling, based at least in part on a simulated object controller, the waypoint, the simulation cost, and the termination attribute, the simulated object in the simulated environment; and
controlling, based at least in part on simulation data that represents a response of an autonomous vehicle controller operating in the simulated environment, the simulated vehicle in the simulated environment.

7. The method of claim 6, wherein instantiating the simulated object comprises:
determining the position of the simulated vehicle; and
determining that the position is within the instantiation region.

8. The method of claim 6, wherein controlling the simulated object comprises:
generating a candidate trajectory associated with the simulated object;
determining a candidate cost that indicates a difference between the waypoint and the candidate trajectory; and
modifying the candidate trajectory to minimize the candidate cost.

9. The method of claim 8, further comprising:
determining an attribute associated with the simulated vehicle; and
wherein generating the candidate trajectory is based at least in part on the attribute.

10. The method of claim 9, wherein the attribute comprises at least one of:
a vehicle position;
a vehicle velocity;
a vehicle acceleration; or
a vehicle action.

11. The method of claim 8, wherein the difference is a first difference, and wherein the waypoint is associated with a simulated object attribute comprising at least one of:
an object position;
an object velocity;
an object acceleration; or
an object arrival time, and
wherein determining the candidate cost comprises:
determining a second difference between the simulated object attribute and the candidate trajectory.

12. The method of claim 6, wherein the position is a first position, the method further comprising:
determining a second position associated with the simulated vehicle;
generating, based at least in part on the log data, a destruction region that is associated with the simulated object; and
destroying, based at least in part on the destruction region and the second position, the simulated object.

13. A non-transitory computer-readable medium storing instructions executable by a processor, wherein the instructions, when executed, cause the processor to perform operations comprising:
receiving data that is based at least in part on sensor data captured by a vehicle traversing an environment;
generating, based at least in part on the data, a simulated scenario comprising a simulated environment;
determining, based at least in part on the data, a region that is associated with a simulated object in the simulated environment;
instantiating, based at least in part the region and a position of a simulated vehicle and independent of log data, the simulated object;
determining, based at least in part on the log data, a termination attribute associated with the simulated object;
determining a waypoint associated with the simulated object;
controlling, based at least in part on simulation data that represents a response of a simulated object controller operating in the simulated environment, the waypoint, and the termination attribute, the simulated object in the simulated environment; and
controlling, based at least in part on a vehicle controller, the simulated vehicle in the simulated environment.

14. The non-transitory computer-readable medium of claim 13, wherein instantiating the simulated object comprises:
determining the position associated with the simulated vehicle; and
determining that the position is within the region.

15. The non-transitory computer-readable medium of claim 13, wherein controlling the simulated object comprises:
generating a candidate trajectory associated with the simulated object;
determining a candidate cost that indicates a difference between the waypoint and the candidate trajectory; and
modifying the candidate trajectory to reduce the candidate cost.

16. The non-transitory computer-readable medium of claim 15, the operations further comprising:
determining an attribute associated with the simulated vehicle; and
wherein generating the candidate trajectory is based at least in part on the attribute.

17. The non-transitory computer-readable medium of claim 16, wherein the attribute comprises at least one of:
a vehicle position;
a vehicle velocity;
a vehicle acceleration; or
a vehicle action.

18. The non-transitory computer-readable medium of claim 15, wherein:
the difference is a first difference;
the waypoint is associated with a simulated object attribute comprising at least one of:
an object position;
an object velocity;
an object acceleration; or
an object arrival time, and
determining the candidate cost comprises:
determining a second difference between the simulated object attribute and the candidate trajectory.

19. The non-transitory computer-readable medium of claim 13, wherein the region is a first region, the operations further comprising:
determining a second region that is associated with the simulated object; and
destroying, based at least in part on the second region, the simulated object.

20. The non-transitory computer-readable medium of claim 19, wherein the position is a first position, and wherein determining the second region comprises:
determining at least one of a:
a second position of the simulated vehicle;
a third position of the simulated object; or
a classification associated with the simulated object.

* * * * *